(12) United States Patent
Yang et al.

(10) Patent No.: US 8,617,947 B2
(45) Date of Patent: Dec. 31, 2013

(54) METHOD OF MANUFACTURING SEMICONDUCTOR DEVICE

(75) Inventors: Jun-kyu Yang, Seoul (KR); Phil-ouk Nam, Hwaseong-si (KR); Ki-hyun Hwang, Seongnam-si (KR); Jae-young Ahn, Seongnam-si (KR); Han-mei Choi, Seoul (KR); Bi-o Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 56 days.

(21) Appl. No.: 13/456,392

(22) Filed: Apr. 26, 2012

(65) Prior Publication Data

US 2012/0276702 A1 Nov. 1, 2012

(30) Foreign Application Priority Data

Apr. 27, 2011 (KR) .................. 10-2011-0039721

(51) Int. Cl.
*H01L 21/8238* (2006.01)

(52) U.S. Cl.
USPC ............ 438/199; 438/502; 257/E21.632

(58) Field of Classification Search
USPC .......... 438/197, 199, 217, 308, 502, 509; 257/E21.632
See application file for complete search history.

(56) References Cited

U.S. PATENT DOCUMENTS 5,949,115 A * 9/1999 Yamazaki et al. ............ 257/396

FOREIGN PATENT DOCUMENTS

| JP | 11-121375 | 4/1999 |
|---|---|---|
| KR | 1998-0012414 | 4/1998 |
| KR | 10-0203130 | 3/1999 |

* cited by examiner

*Primary Examiner* — Hoai V Pham
(74) *Attorney, Agent, or Firm* — Lee & Morse, P.C.

(57) ABSTRACT

A method of manufacturing a semiconductor device includes forming a channel region, forming a buffer layer on the channel region, and heat-treating the channel region by using a gas containing halogen atoms.

20 Claims, 16 Drawing Sheets

METHOD OF MANUFACTURING SEMICONDUCTOR DEVICE

CROSS-REFERENCE TO RELATED APPLICATIONS

This application claims the benefit of Korean Patent Application No. 10-2011-0039721, filed on Apr. 27, 2011, in the Korean Intellectual Property Office, the disclosure of which is incorporated herein in its entirety by reference.

BACKGROUND

A semiconductor device having a high capacity data process capability despite having a decreased size is desirable. Thus, a degree of integration of a semiconductor memory device included in the semiconductor device should be increased.

SUMMARY

Embodiments may be realized by providing a method of manufacturing a semiconductor device that includes forming a channel region, forming a buffer layer on the channel region, and heat-treating the channel region by using a gas containing halogen atoms.

Forming the buffer layer may include cleansing the channel region to form a cleansed channel region, and forming the buffer layer on the cleansed channel region, the buffer layer being a chemical oxide layer. The method may include, after heat-treating the channel region, removing the buffer layer. The channel region may have a smaller hydrogen content after the channel region is heat-treated than before the channel region is heat-treated.

The buffer layer may be formed by thermally oxidizing the channel region or may be formed on the channel region by using a chemical vapor deposition process. The method may include forming a gate insulating layer on the channel region, and foaming a gate electrode on the gate insulating layer. The channel region may be a polycrystalline silicon layer.

Forming the channel region may include forming an amorphous silicon layer, and crystallizing the amorphous silicon layer by a second heat-treatment to form the polycrystalline silicon layer. The buffer layer may include an insulating material. The buffer layer may include an oxide or a nitride. A thickness of the buffer layer may be in a range of about 5 Å to about 15 Å.

Embodiments may also be realized by providing a method of manufacturing a semiconductor device that includes alternately stacking interlayer sacrificial layers and interlayer insulating layers on a substrate, forming first openings through the interlayer sacrificial layers and the interlayer insulating layers such that the first openings expose the substrate, forming channel regions in the first openings, forming buffer layers on the channel regions, and heat-treating the channel regions by using a gas containing halogen atoms.

The method may include forming buried insulating layers on the channel regions such that the first openings are filled, forming second openings through the interlayer sacrificial layers and the interlayer insulating layers, the second openings are between the channel regions and exposing the substrate, forming side openings through which the channel regions and the insulating layers are partially exposed, the side openings extending from the second openings and being formed by removing the interlayer sacrificial layers exposed through the second openings, forming gate dielectric layers in the side opening, and forming gate electrodes of memory cell transistors and selection transistors on the gate dielectric layers such that the gate electrodes fill the side openings.

The buffer layers may be formed on the channel regions after side openings are formed such that the buffer layers are formed on the exposed channel regions by the side openings. The method may include, before forming the gate dielectric layers, removing the buffer layer.

Embodiments may also be realized by providing a method of manufacturing a transistor that includes forming a polycrystalline silicon layer on a substrate to form a channel region, forming a buffer layer that covers the channel region, and heat-treating the channel region by applying a gas containing halogen atoms to the buffer layer.

During the heat-treating of the channel region, halogen atoms from the gas may spread into the polycrystalline silicon layer of the channel region whereby heat treating the channel region may include diffusing halogen atoms from the halogen containing gas into the polycrystalline silicon layer of the channel region. During the heat-treating of the channel region, a hydrogen content in the polycrystalline silicon layer of the channel region may be reduced.

Forming the buffer layer may include chemically oxidizing the channel region using a mixture including ammonia water and oxygenated water. The buffer layer may be an oxide layer on an upper surface of the channel region on which the gas containing halogen atoms is directly applied. The buffer layer may be formed directly on the polycrystalline silicon layer of the channel region.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
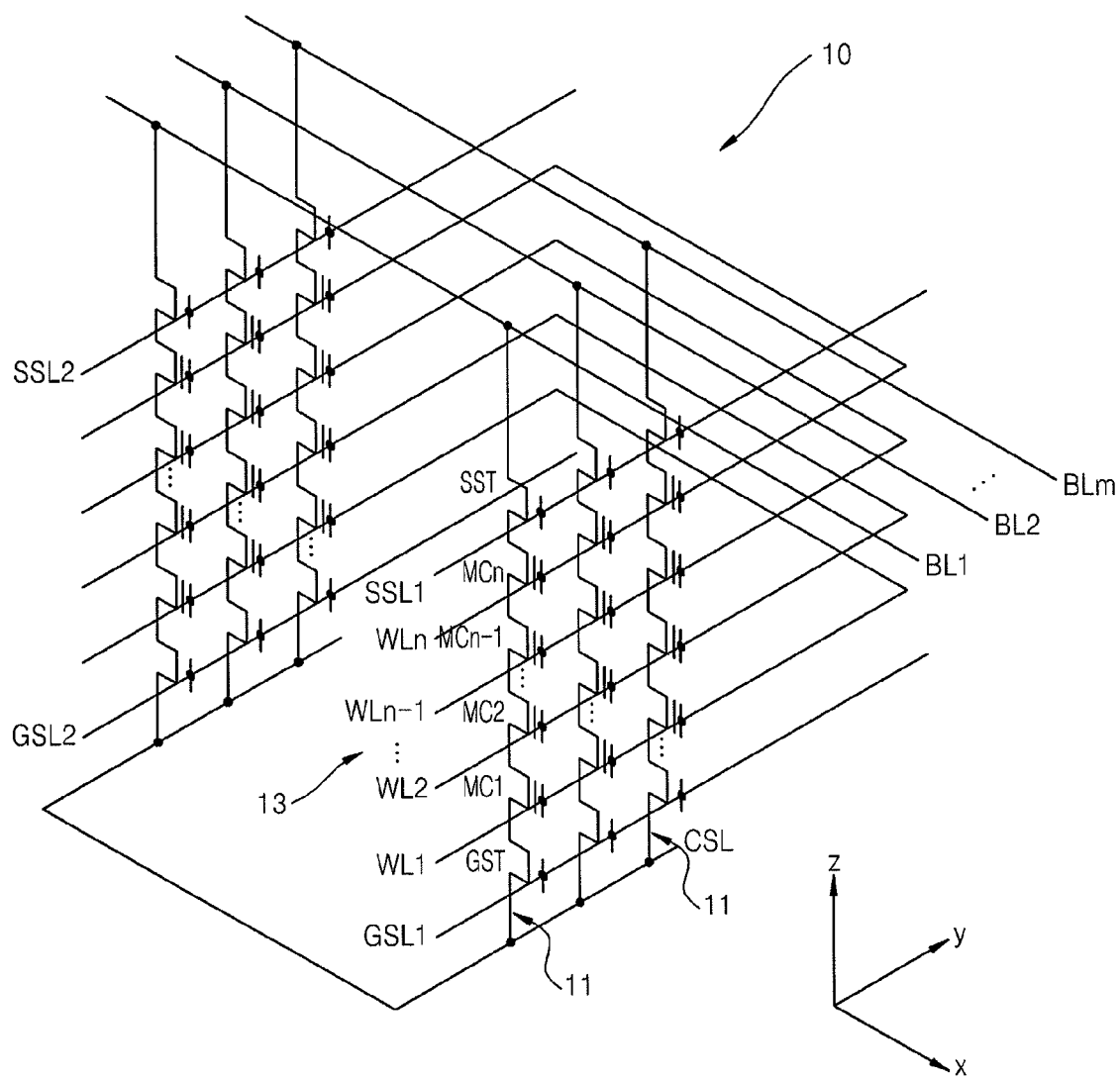
FIG. 1 illustrates an equivalent circuit diagram of a memory cell array of a semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. For example, illustrated shapes may be deformed according to fabrication technology and/or tolerances. Therefore, embodiments are not limited to certain shapes illustrated in the exemplary embodiments of the present specification, and may include modifications of shapes which may occur in fabrication processes. Like reference numerals refer to like elements throughout. Furthermore, various elements and regions in the drawings are schematically drawn. Thus, embodiments are not limited by relative sizes or distances in the drawings.

FIG. 1 illustrates an equivalent circuit diagram of a memory cell array 10 of a semiconductor device, according to an exemplary embodiment. In the present exemplary embodiment, a NAND flash memory device having a vertical channel structure is exemplified.

Referring to FIG. 1, the memory cell array 10 may include a plurality of memory cell strings 11. Each of the plurality of memory cell strings 11 may have a vertical structure in which the memory cell strings 11 extend in a direction, e.g., a z-axis direction, that is perpendicular to other directions, e.g., x- and y-axis directions. The plane of the x- and y-axis directions may include a main surface of a substrate (not shown) having the memory cell strings 11 thereon. A memory cell block 13 may be formed by the memory cell strings 11.

Each of the memory cell strings 11 may include a plurality of memory cells MC1 to MCn, a string selection transistor SST, and a ground selection transistor GST. In each memory cell string 11, the ground selection transistor GST, the plurality of memory cells MC1 to MCn, and the string selection transistor SST may be disposed in series in the vertical direction, e.g., the z-axis direction. The memory cells MC1 to MCn may store data.

A plurality of wordlines WL1 to WLn may be connected to the memory cells MC1 to MCn, respectively, thereby controlling the respective memory cells MC1 to MCn connected thereto. The number of memory cells MC1 to MCn may be appropriately selected according to, e.g., a capacity of a semiconductor memory device.

A plurality of bitlines BL1 to BLm extending in the x-axis direction may be connected to one side of each of the memory cell strings 11 arranged in first through $m^{th}$ columns of the memory cell block 13, e.g., a drain of the string selection transistor SST. A common source line CSL may be connected to the other side of each memory cell string 11, e.g., a source of the ground selection transistor GST.

The wordlines WL1 to WLn that extend in the y-axis direction may be commonly connected to gates of ones of the memory cells MC1 to MCn of the memory cell strings 11 arranged on the same layer. Data may be programmed on, read from, or erased from the memory cells MC1 to MCn by driving the wordlines WL1 to WLn.

In each memory cell string 11, the string selection transistor SST may be arranged between the bitlines BL1 to BLm and the memory cells MC1 to MCn. In the memory cell block 13, each string selection transistor SST may control data transmission between the corresponding bitlines BL1 to BLm and the corresponding memory cells MC1 to MCn by using, e.g., string selection lines SSL1 and SSL2 connected to a gate of each string selection transistor SST.

The ground selection transistor GST may be arranged between the memory cells MC1 to MCn and the common source line CSL. In the memory cell block 13, each ground selection transistor GST may control data transmission between the memory cells MC1 to MCn and the common source line CSL by using ground selection lines GSL1 and GSL2 connected to a gate of each ground selection transistor GST.

Figure 2:
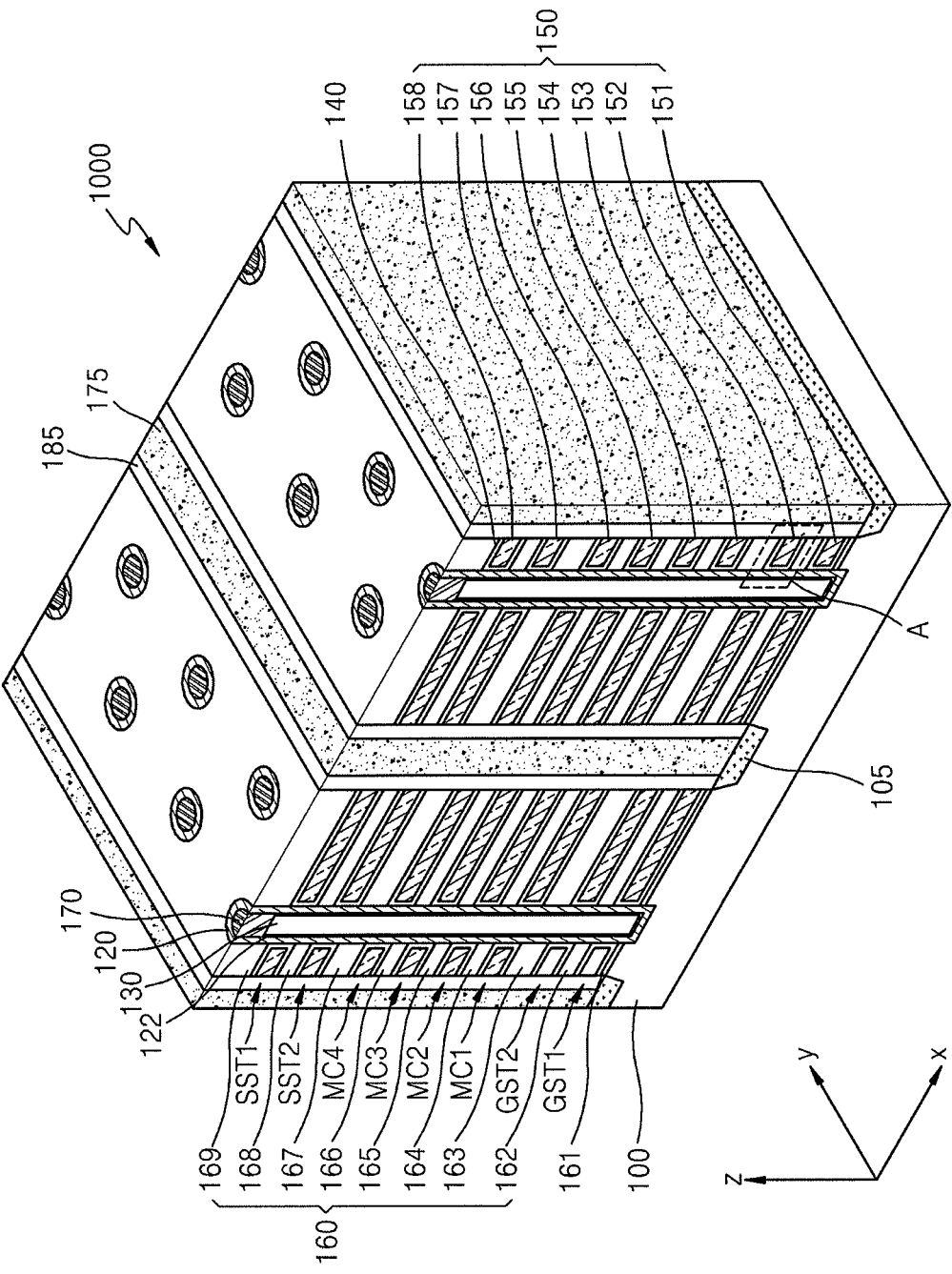
FIG. 2 illustrates a schematic perspective view of a three-dimensional (3D) structure of memory cell strings of a semiconductor device, according to an exemplary embodiment.

FIG. 2 illustrates a schematic perspective view of a three-dimensional (3D) structure of memory cell strings of a semiconductor device 1000, according to an exemplary embodiment. In FIG. 2, some elements that constitute the memory cell strings 11 of FIG. 1 may be omitted. For example, the bitlines BL1 to BLm of the memory cell strings 11 are omitted.

Referring to FIG. 2, the semiconductor device 1000 may include a channel region 120 disposed on a substrate 100 and a plurality of memory cell strings disposed along a side surface of the channel region 120. For example, the plurality of memory cell strings may be arranged in the y-axis direction along the side surfaces of the channel regions 120 disposed in the y-axis direction. As illustrated in FIG. 2, the memory cell strings 11 (see FIG. 1) that extend from the substrate 100 in the z-axis direction may be arranged along the side surface of the channel region 120. Each memory cell string 11 of FIG. 1 may include two ground selection transistors GST1 and GST2, a plurality of memory cells MC1, MC2, MC3, and MC4, and two string selection transistors SST1 and SST2.

The substrate 100 may have a main surface extending in the x-axis direction and the y-axis direction. The substrate 100 may include a semiconductor material, e.g., a Group IV semiconductor, a Group III-V compound semiconductor, or a Group II-VI oxide semiconductor. For example, the Group IV semiconductor may be silicon, germanium, or silicon-germanium. The substrate 100 may also be, e.g., a bulk wafer or an epitaxial layer.

The channel regions 120 having pillar shapes may be disposed on the substrate 100 to extend in the z-axis direction. The channel regions 120 may be spaced apart from each other in the x-axis direction and the y-axis direction, and may be disposed, e.g., in a zigzag form in the y-axis direction. Although two columns of the channel regions 120 are disposed in the zigzag form FIG. 2, embodiments are not limited thereto. For example, three or more columns of the channel regions 120 may be disposed in the zigzag form.

The channel region 120 may have an annular shape, e.g., may have a cylindrical shape extending in the z-axis direction. The bottom surfaces of the channel regions 120 may directly contact the substrate 100 and may be electrically connected to the substrate 100. The channel regions 120 may include, e.g., a semiconductor material such as polycrystalline silicon or mono crystalline silicon. The semiconductor material may not be doped or may include a p-type or n-type impurity. A buried insulating layer 130 may be formed in the channel region 120. In FIG. 2, the channel regions 120 arranged adjacent to each other with a common source line 175 interposed therebetween may be symmetrical. However, embodiments are not limited thereto.

A buffer layer 122 may be disposed between the channel region 120 and the buried insulating layer 130. The buffer layer 122 may, e.g., reduce the possibility of and/or prevent the channel region 120 from being damaged during heat treatment thereof. The buffer layer 122 may be removed according to some exemplary embodiments, and thus may not exist in the final semiconductor device 1000. The buffer layer 122 may include, e.g., an insulating material such as silicon oxide and/or silicon nitride. The buffer layer 122 may include, e.g., at least one of an aluminum oxide (e.g., $Al_2O_3$), a tantalum oxide (e.g., $Ta_2O_3$), a titanium oxide (e.g., $TiO_2$), an yttrium oxide (e.g., $Y_2O_3$), a zirconium oxide (e.g., $ZrO_2$), a zirconium silicon oxide (e.g., $ZrSi_xO_y$), a hafnium oxide (e.g., $HfO_2$), a hafnium silicon oxide (e.g., $HfSi_xO_y$), a lanthanum oxide (e.g., $La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide (e.g., $Pr_2O_3$). A thickness of the buffer layer 122 may be in a range of about 5 Å to about 15 Å.

The first string selection transistors SST1 arranged in the x-axis direction may be commonly connected to the bitlines BL1~BLm (see FIG. 1). The first ground selection transistors GST1 arranged in the x-axis direction may be electrically connected to impurity regions 105 adjacent to the first ground selection transistors GST1.

The impurity regions 105 may be adjacent to the main surface of the substrate 100, may extend in the y-axis direction, and may be spaced apart from each other in the x-axis direction. The impurity regions 105 may be source regions and may form PN junctions with other regions of the substrate 100. The impurity regions 105 may include a high-concentration impurity region (not shown) adjacent to the main surface of the substrate 100 and disposed in the center of the impurity regions 105. The impurity regions 105 may include a low-concentration impurity region (not shown) disposed at opposing ends of the high-concentration impurity region.

The common source line 175 may be formed on the impurity regions 105, may extend in the z-axis direction away from the substrate 100, and may form an ohmic contact with the impurity regions 105. The common source line 175 may provide the ground selection transistors GST1 and GST2 of the memory cell strings of side surfaces of the two channel regions 120 adjacent in the x-axis direction with source regions. The common source line 175 may extend in the y-axis direction along the impurity regions 105. The common source line 175 may include a conductive material. For example, the common source line 175 may include a metal material, e.g., at least one of tungsten (W), aluminum (Al), and copper (Cu).

Although not shown in FIG. 2, a silicide layer may be disposed between the impurity regions 105 and the common source line 175, e.g., to reduce contact resistance. The silicide layer (not shown) may include a metal silicide layer, e.g., a cobalt silicide layer. An insulating region 185 having a spacer shape may be formed on both side surfaces of the common source line 175.

A plurality of gate electrodes 150 including gate electrodes 151 to 158 may be arranged from the substrate 100 to be spaced apart from each other in the z-axis direction along the side surfaces of the channel regions 120. The plurality of gate electrodes 150 may include gate electrodes of the ground selection transistors GST1 and GST2, the memory cells MC1, MC2, MC3, and MC4, and the string selection transistors SST1 and SST2. The gate electrodes 150 may be commonly connected to the adjacent memory cell strings 11 of FIG. 1 arranged in the y-axis direction. The gate electrodes 157 and 158 of the string selection transistors SST2 and SST1, respectively, and may be connected to the string selection line SSL (see FIG. 1).

The gate electrodes 153, 154, 155, and 156 of the gate electrodes 150 may be for the memory cells MC1, MC2, MC3, and MC4, respectively, and may be connected to the wordlines WL1, WL2, WLn−1, and WLn (see FIG. 1), respectively. The gate electrodes 151 and 152 of the gate electrodes 150 may be for the ground selection transistors GST1 and GST2, respectively, and may be connected to the ground selection line GSL (see FIG. 1). The gate electrodes 150 may include a metallic layer, e.g., a layer including tungsten (W). Although not shown, the gate electrodes 150 may further include a diffusion barrier layer. For example, the diffusion barrier layer may include at least one of tungsten nitride (WN), tantalum nitride (TaN), and titanium nitride (TiN).

A gate dielectric layer 140 may be disposed between the channel region 120 and the gate electrodes 150. The gate dielectric layer 140 may include, e.g., a tunneling insulating layer 142 (see FIG. 3A), a charge storage layer 144 (see FIG. 3A), and a blocking insulating layer 146 (see FIG. 3A) that are sequentially stacked on the channel region 120.

A plurality of interlayer insulating layers 160 including interlayer insulating layers 161 to 169 may be arranged. The interlayer insulating layers 160 may be spaced apart from each other in the z-axis direction and may extend in the y-axis direction, e.g., like the gate electrodes 150. Side surfaces of the interlayer insulating layers 160 may contact the channel regions 120. The interlayer insulating layers 160 may include, e.g., silicon oxide or silicon nitride.

In FIG. 2, four memory cells, i.e., the memory cells MC1, MC2, MC3, and MC4, are arranged. However, embodiments are not limited thereto, e.g., a larger or smaller number of memory cells than four memory cells may be arranged according to the capacity of the semiconductor device 1000.

The string selection transistor SST and the ground selection transistor GST may have a different structure from that of the memory cells MC1, MC2, MC3, and MC4. The string selection transistors SST1 and SST2 and the ground selection transistors GST1 and GST1 of the memory cell strings may be paired with each other, respectively, in exemplary embodiments. For example, the number of the string selection transistors SST1 and SST2 and the ground selection transistors GST1 and GST1 may be at least two, e.g., so that the gate length of the selected gate electrodes 151, 152, 157, and 158 may be greatly reduced compared to a case where the number of the string selection transistors and the ground selection transistors is one. Thus, the interlayer insulating layers 160 may be filled with the selected gate electrodes 151, 152, 157, and 158 without voids. However, the embodiments are not limited thereto. For example, the memory cell string may include one string selection transistor and one ground selection transistor like the string selection transistor SST and the ground selection transistor GST of FIG. 1.

Figure 3A:
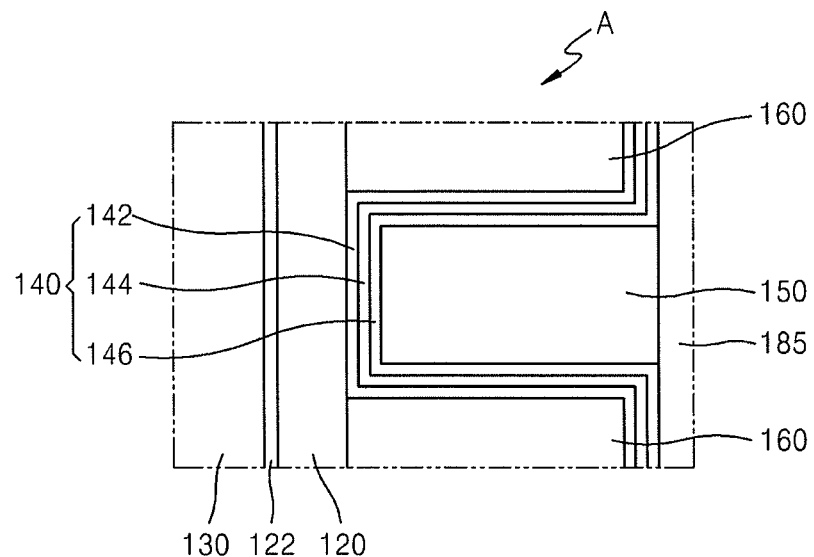
FIG. 3A illustrates an enlarged cross-sectional view of portion A of FIG. 2 for explaining an exemplary gate dielectric layer of FIG. 2.
Figure 3B:
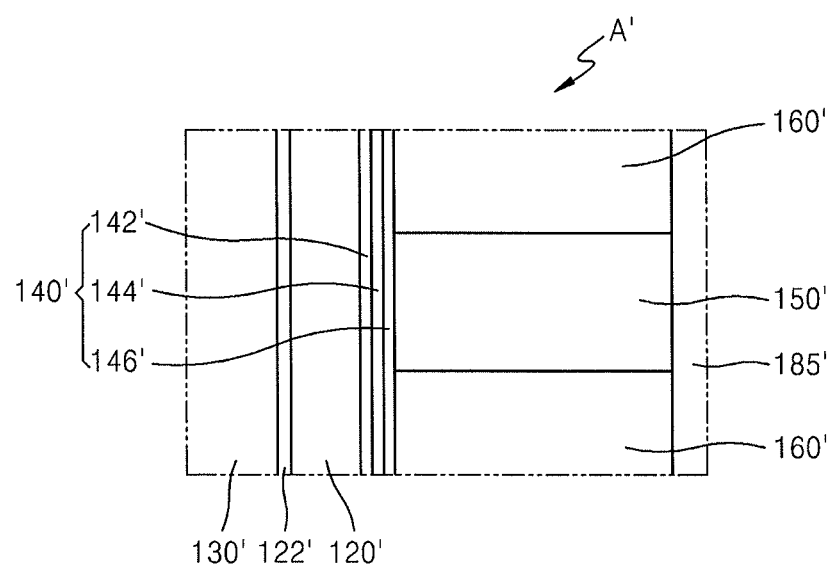
FIG. 3B illustrates an enlarged cross-sectional view of an arrangement of a gate dielectric layer according to an exemplary embodiment.

FIG. 3A illustrates an enlarged cross-sectional view of portion A of FIG. 2 for explaining the gate dielectric layer 140 of FIG. 2. FIG. 3B illustrates an enlarged cross-sectional view of an arrangement of a gate dielectric layer 240 according to another exemplary embodiment.

Referring to FIG. 3A, the channel region 120 that may be used as a channel of the memory cell strings 11 of FIG. 1 is illustrated. The buffer layer 122 and the buried insulating layer 130 may be disposed on a left side surface of the channel region 120. Selectively, the buffer layer 122 may be removed or excluded, and the buried insulating layer 130 may be disposed on the left side surface of the channel region 120. The gate dielectric layer 140 may be disposed on a partial surface of a right side of the channel region 120. The interlayer insulating layers 160 may contact the right side surface of the channel region 120 and may be disposed in upper and lower portions of the gate dielectric layer 140. The gate dielectric layer 140 may cover a right side surface of the upper interlayer insulating layer 160, surround the gate electrode 150, and form one surface to cover a right side surface of the lower interlayer insulating layer 160. The insulating region 185 may be disposed on right sides of the gate electrodes 150 and the gate dielectric layer 140.

The gate dielectric layer 140 may have a structure in which the tunneling insulating layer 142, the charge storage layer 144, and the blocking insulating layer 146 are sequentially stacked on the right side wall of the channel region 120.

The tunneling insulating layer 142 may tunnel charges to the charge storage layer 144 using, e.g., a Fowler-Nordheim (F-N) process. The tunneling insulating layer 142 may include at least one of a silicon oxide (e.g., $SiO_2$), a silicon nitride (e.g., $Si_3N_4$), a silicon oxynitride (e.g., SiON), a hafnium oxide (e.g., $HfO_2$), a hafnium silicon oxide (Hf-$Si_xO_y$), an aluminum oxide (e.g., $Al_2O_3$), and a zirconium oxide (e.g., $ZrO_2$). The tunneling insulating layer 142 may be a single layer or a composite layer.

The charge storage layer 144 may be, e.g., a charge trapping layer or a floating gate conductive layer. When the charge storage layer 144 is the floating gate conductive layer, the charge storage layer 144 may be formed by depositing polycrystalline silicon on the substrate 100 by performing chemical vapor deposition (CVD), e.g., low pressure CVD (LPCVD) using a $SiH_4$ gas, a $Si_2H_6$ gas, and/or a $PH_3$ gas. When the charge storage layer 144 is the charge trapping layer, the charge storage layer 144 may include at least one of a silicon oxide (e.g., $SiO_2$), a silicon nitride (e.g., $Si_3N_4$), a silicon oxynitride (e.g., SiON), a hafnium oxide (e.g., $HfO_2$), a zirconium oxide (e.g., $ZrO_2$), a tantalum oxide (e.g., $Ta_2O_5$), a titanium oxide (e.g., $TiO_2$), a hafnium aluminum oxide ($HfAl_xO_y$), a hafnium tantalum oxide ($HfTa_xO_y$), a hafnium silicon oxide ($HfSi_xO_y$), an aluminum oxide ($Al_xN_y$), and an aluminum gallium oxide ($AlGa_xN_y$). The charge storage layer 144 may include quantum dots or nanocrystals. In this regard, the quantum dots or the nanocrystals may include an electric conductor, e.g., metal or fine particles of a semiconductor.

The blocking insulating layer 146 may include at least one of a silicon oxide (e.g., $SiO_2$), a silicon nitride (e.g., $Si_3N_4$), a silicon oxynitride (e.g., SiON), and a high-k dielectric material. The high-k dielectric material has a higher dielectric constant than that of an oxide, e.g., a silicon oxide. The blocking insulating layer 146 may be formed of material having a higher dielectric constant than that of the tunneling insulating layer 142. The high-k dielectric material layer may include at least one of an aluminum oxide (e.g., $Al_2O_3$), a tantalum oxide (e.g., $Ta_2O_5$), a titanium oxide (e.g., $TiO_2$), a yttrium oxide (e.g., $Y_2O_3$), a zirconium oxide (e.g., $ZrO_2$), a zirconium silicon oxide ($ZrSi_xO_y$), a hafnium oxide (e.g., $HfO_2$), a hafnium silicon oxide ($HfSi_xO_y$), a lanthanum oxide (e.g., $La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide (e.g., $Pr_2O_3$).

Referring to FIG. 3B, a buffer layer 122' and a buried insulating layer 130' may be disposed on a left side surface of a channel region 120', according to an other exemplary embodiment. Selectively, the buffer layer 122' may be removed or excluded, and the buried insulating layer 130' may be disposed on the left side surface of the channel region 120'. The gate dielectric layer 140' may be disposed on a surface, e.g., entire surface, of a right side of the channel region 120'. A gate electrode 150' may be disposed on a partial surface of a right side of the gate dielectric layer 140'. Interlayer insulating layers 160' may be disposed on upper and lower portions of the gate electrode 150'. An insulating region 185' may be disposed on a right side of the gate electrode 150'.

The gate dielectric layer 140' may have a structure in which a tunneling insulating layer 142', a charge storage layer 144', and a blocking insulating layer 146' are sequentially stacked on a right side wall of the channel region 120'. The tunneling insulating layer 142', the charge storage layer 144', and the blocking insulating layer 146' may be substantially the same as the tunneling insulating layer 142, the charge storage layer 144, and the blocking insulating layer 146 of FIG. 3A.

FIGS. 4A through 4L illustrates cross-sectional views of the semiconductor device 1000 of FIG. 2 and depict stages in a method of manufacturing the semiconductor device 1000, according to an exemplary embodiment. The perspective view of FIG. 2 is seen in the y-axis direction with respect to stages.

Figure 4A:
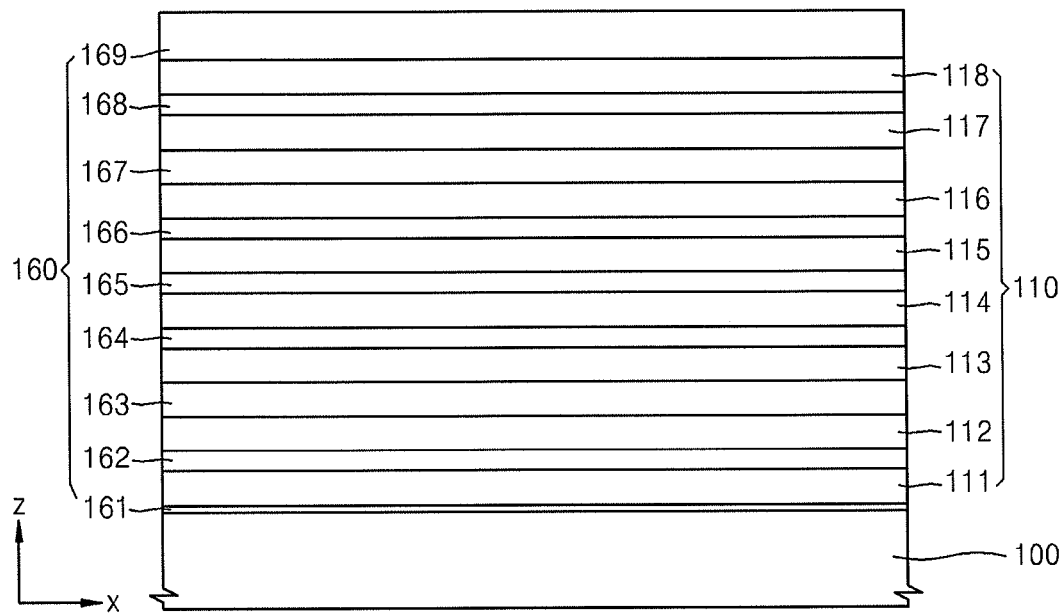
FIGS. 4A through 4L illustrate cross-sectional views depicting stages in a method of manufacturing the semiconductor device of FIG. 2, according to an exemplary embodiment, wherein the perspective view of FIG. 2 is seen in the y-axis direction with respect to the stages.

Referring to FIG. 4A, a plurality of interlayer sacrificial layers 110, e.g., including interlayer sacrificial layers 111 through 118, and a plurality of interlayer insulating layers 160, e.g., including interlayer insulating layers 161 to 169, may be alternately stacked on the substrate 100. The interlayer sacrificial layers 110 and the interlayer insulating layers 160 may be alternately stacked on the substrate 100 starting from the first interlayer insulating layer 161, as illustrated in FIG. 4A.

The interlayer sacrificial layers 110 may be formed of materials having an etching selectivity with respect to the interlayer insulating layers 160, e.g., so that the interlayer sacrificial layers 110 may be etched. For example, the interlayer sacrificial layers 110 may be formed of materials by which the interlayer sacrificial layers 110 may be etched while minimizing etching of the interlayer insulating layers 160 during a process of etching the interlayer sacrificial layers 110. This etching selectivity may be expressed in a quantitative manner by using a ratio of an etch rate of the interlayer sacrificial layers 110 to the etch rate of the interlayer insulating layers 160. The interlayer insulating layers 160 may be formed of, e.g., at least one of a silicon oxide and a silicon nitride. The interlayer sacrificial layers 110 may be formed of, e.g., one of a silicon layer, a silicon oxide layer, a silicon carbide layer, and a silicon nitride layer in a manner such that the interlayer sacrificial layers 110 are different from the interlayer insulating layers 160.

According to an embodiment, the thicknesses of the interlayer insulating layers 160 may not be the same, e.g., as illustrated in FIG. 4A. The thicknesses of the interlayer insulating layers 160 and the interlayer sacrificial layers 110 may be modified in various ways. The number of layers that constitute the interlayer insulating layers 160 and the interlayer sacrificial layers 110 may also differ.

Figure 4B:
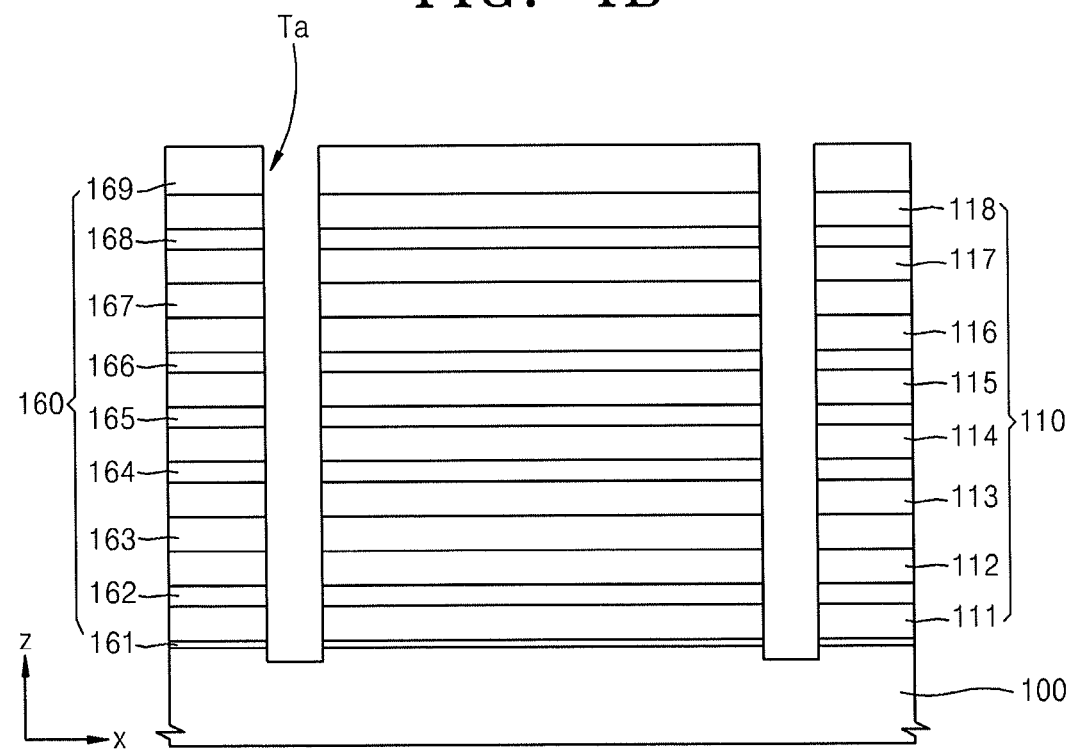

Referring to FIG. 4B, first openings Ta may be formed that pass through the interlayer insulating layers 160 and the interlayer sacrificial layers 110 that are alternately stacked on the substrate 100. The first openings Ta may expose the substrate 100. The first openings Ta may be holes having a predetermined depth in the z-axis direction. The first openings Ta may be isolation regions that are formed to be spaced apart from each other in the x- and y-axis directions (see FIG. 2).

An operation of forming the first openings Ta may include, e.g., first forming a predetermined mask pattern that defines positions of the first openings Ta on the alternately-stacked interlayer insulating layers 160 and the interlayer sacrificial layers 110. Then, the alternately-stacked interlayer insulating layers 160 and the interlayer sacrificial layers 110 may be anisotropically etched by using the mask pattern as an etch mask. Although not shown, since a structure including two types of different layers is etched, sidewalls of the first openings Ta may not be perpendicular to the top surface of the substrate 100, e.g., the sidewalls may be disposed at an incline. For example, one portion of a first opening Ta that is closer to the substrate 100 may have may a smaller width than another portion of the first opening Ta that is further away from the substrate 100.

The first openings Ta may be formed to expose the top surface of the substrate 100 as shown in FIG. 4B. As shown in FIG. 4B, the substrate 100 may be recessed to a predetermined depth below the first openings Ta, e.g., as a result of over etching during the anisotropic etching.

Figure 4C:
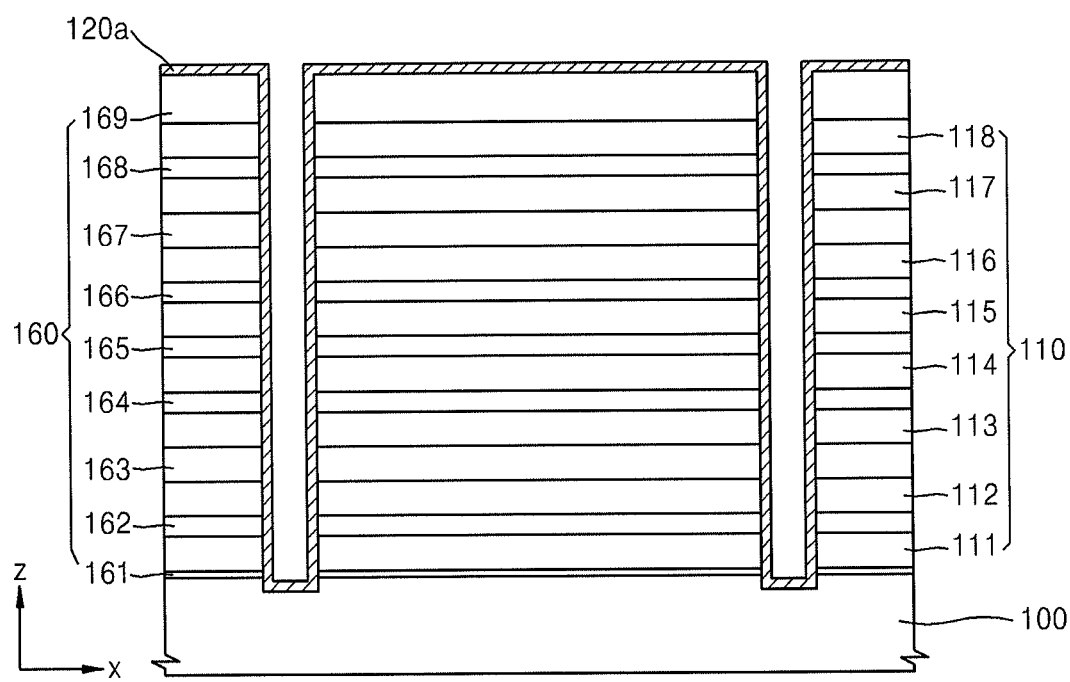

Referring to FIG. 4C, a channel region forming layer 120a that forms the channel region 120 may be formed to cover, e.g., uniformly cover, inner walls, and a lower surface of the first openings Ta. The channel region forming layer 120a may be a continuous layer that is later etched to form the channel region 120 so that the channel region 120 is a part of the channel region forming layer 120a. The channel region forming layer 120a may be formed by, e.g., directly depositing polycrystalline silicon, or depositing amorphous silicon, crystallizing the deposited amorphous silicon through heat treatment, and forming polycrystalline silicon. The channel region forming layer 120a may be formed to have a predetermined thickness, e.g., a thickness of about 1/50 to about 1/5 of the widths of the first openings Ta. The channel region forming layer 120a may be formed by using, e.g., atomic layer deposition (ALD) or chemical vapor deposition (CVD). The channel region forming layer 120a may directly contact the substrate 100 and be electrically connected thereto on the lower surfaces of the first openings Ta.

Figure 4D:
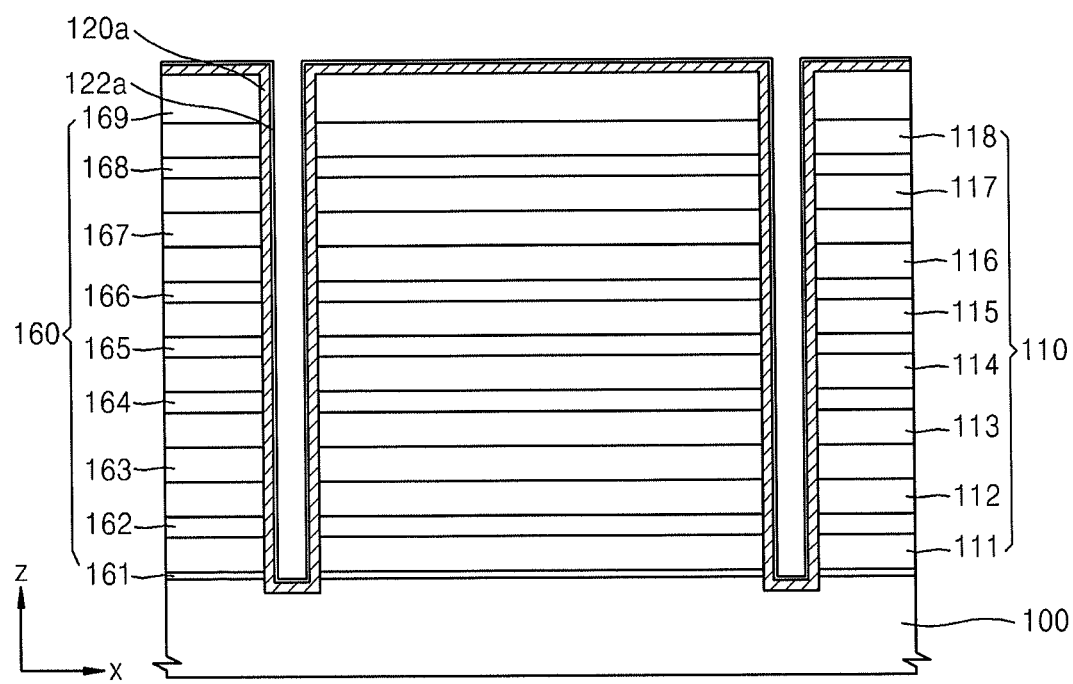

Referring to FIG. 4D, a buffer layer forming layer 122a for forming the buffer layer 122 may be disposed on the channel region forming layer 120a, e.g., to completely cover the channel region forming layer 120a. The buffer layer forming layer 122a may be a continuous layer that is later etched to form the buffer layer 122 so that the buffer layer 122 is a part of the buffer layer forming layer 122a. The buffer layer forming layer 122a may include an insulating material, such as a silicon oxide or a silicon nitride. A thickness of the buffer layer 122 may be in a range of about 5 Å to about 15 Å. However, the range for the thickness of the buffer layer 122 is not limited thereto, e.g., the range may be about 10 Å to about 15 Å, about 6 Å to about 8 Å, etc. If the thickness of the buffer layer 122 exceeds this range, halogen atoms may be prevented from spreading to the buffer layer 122 during a subsequent thermal process. Accordingly, when the thickness of the buffer layer 122 is within the range of about 5 Å to about 15 Å, halogen atoms may be able to spread into the buffer layer 122 during the subsequent thermal process.

The buffer layer forming layer 122a may be formed by using, e.g., a thermal oxidation process, a plasma oxidation process, or an ALD or plasma enhanced chemical vapor deposition (PECVD) process. If the buffer layer 122 is formed of a silicon oxide, the buffer layer 122 may be formed by cleansing the channel region 120 by using, e.g., a standard clean-1 (SC1) solution that is a mixture solution of ammonia water, e.g., aqueous ammonia ($NH_3$), and oxygenated water. For example, a part of the channel region forming layer 120a that forms the channel region 120 may be chemically oxidized by using the SC1 solution so that a silicon oxide layer may be formed on the surface of the channel region 120 as the buffer layer 122. As described above, the method of forming a chemical oxide by using the SC1 solution is advantageously simple and easy. In a modified embodiment, the buffer layer 122 may be formed on a native oxide layer or may be formed of the native oxide.

Figure 4E:
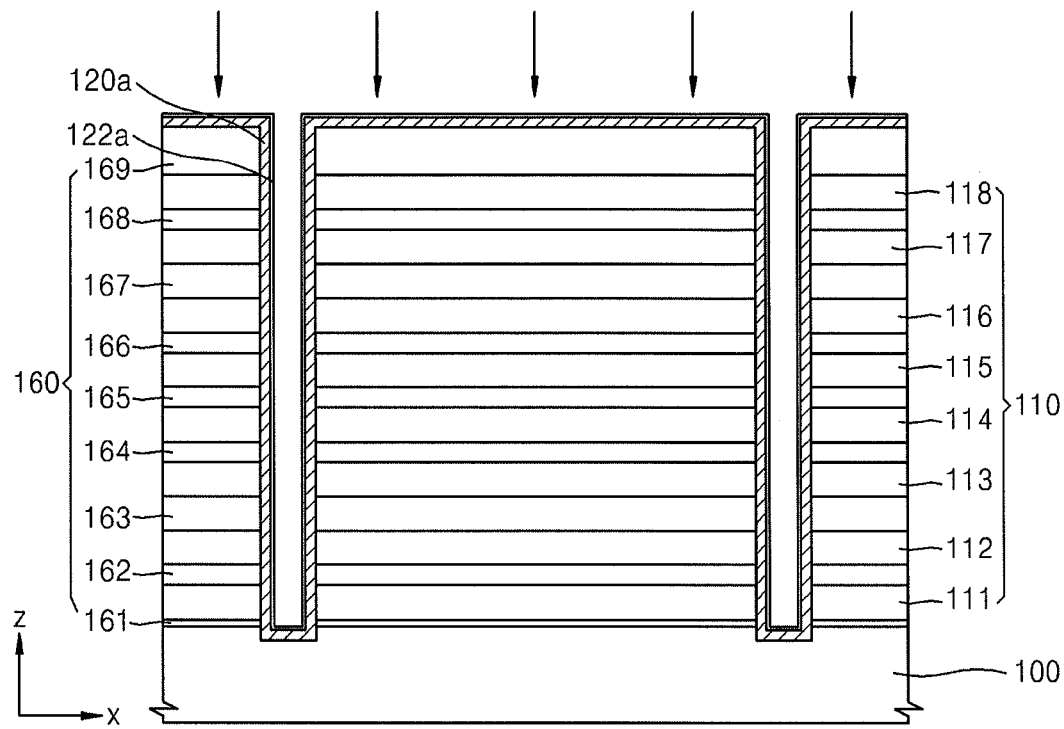

Referring to FIG. 4E, heat treatment may be performed on the channel region forming layer 120a. The heat treatment may be performed so that the entire channel region forming layer 120a is heated, e.g., exposed to a higher temperature. An arrow in FIG. 4E indicates that the heat treatment is performed. The heat treatment may be performed at a temperature of about 300° C. to about 500° C. and at a pressure of about 100 Torr by using a halogen containing gas. For example, the halogen containing gas may include halogen atoms, e.g., primarily only halogen atoms, therein. The heat treatment using the halogen containing gas may be performed for several minutes or several tens of minutes, e.g., for more than 3 minutes. These ranges of the temperature, pressure, and time may vary according to the thickness of the channel region 120 in such a way that halogen atoms can spread into the channel region 120. The halogen containing gas may include, e.g., at least one of $Cl_2$, $ClF_3$, $F_2$, and $NF_3$ gases. Accordingly, the heat treatment using the halogen containing gas may change the composition and/or structure of the channel region 120.

In accordance with an exemplary embodiment, the buffer layer 122 may be formed and the heat treatment may be performed thereafter, e.g., to cure and/or reduce a defect in the channel region 120 that includes polycrystalline silicon. For example, a defect in a grain boundary may be cured and/or reduced. According to an exemplary embodiment, the halogen containing gas may reduce a dangling bonding in the channel region 120 and replace a Si—H combination with a Si—Cl or Si—F combination. The Si—Cl or Si—F combination has a greater and more stable combined energy than the Si—H combination. Thus, a trap density in the channel region 120 may be reduced. The reduction in the trap density may enhance the characteristics of a semiconductor device, which will be described in detail later with reference to FIGS. 9A through 11.

Figure 4F:
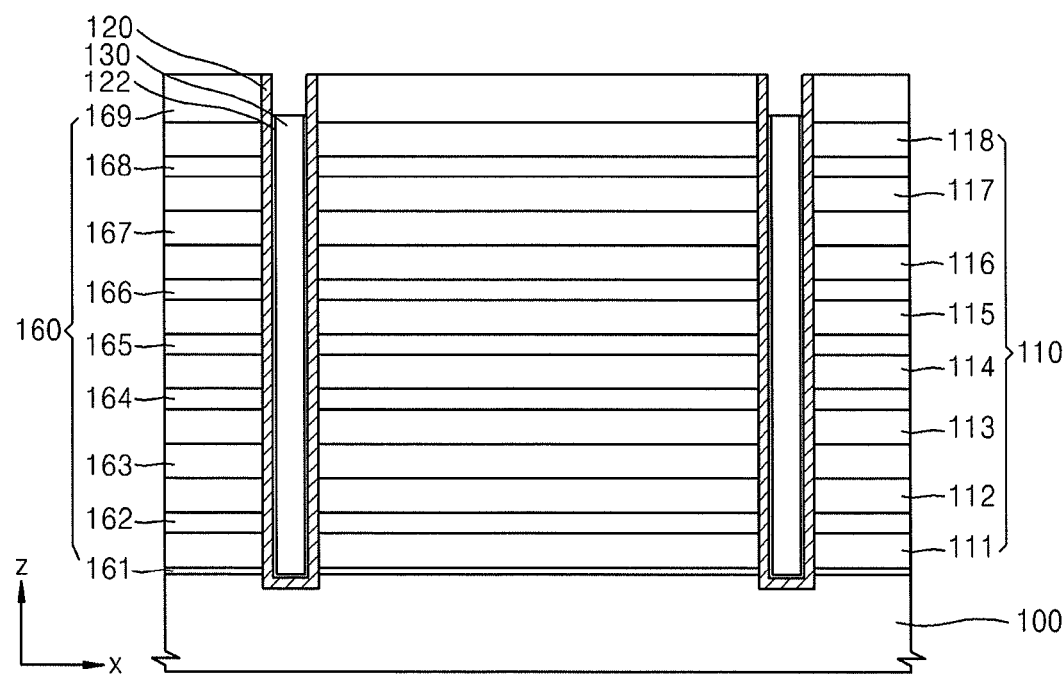

Referring to FIG. 4F, the first openings Ta may be buried by the buried insulating layer 130. For example, the first openings Ta may be filed with an insulating layer forming layer that forms the insulating layer 130. Optionally, before the buried insulating layer 130 is formed, an operation of removing the buffer layer forming layer 122a that includes the buffer layer 122 may be performed.

Then, a planarization process may be performed in order to remove unnecessary semiconductor material and insulating material that cover the ninth interlayer insulating layer 169. The planarization process may be performed so that an upper surface of the ninth interlayer insulating layer 169 is exposed. For example, the buffer layer 122 and a part of an upper portion of the buried insulating layer 130 may be removed using an etching process, such as an etch-back process. That is, the buried insulating layer 130 may be buried by not filling in the top surface of the ninth interlayer insulating layer 169 but by filling in first openings Ta to a predetermined depth with respect to the ninth interlayer insulating layer 169. After the planarization process, at least the channel region 120 and the buried insulating layer 130 may remain in the first openings Ta. The buffer layer 122 may remain or may have been previously removed.

Figure 4G:
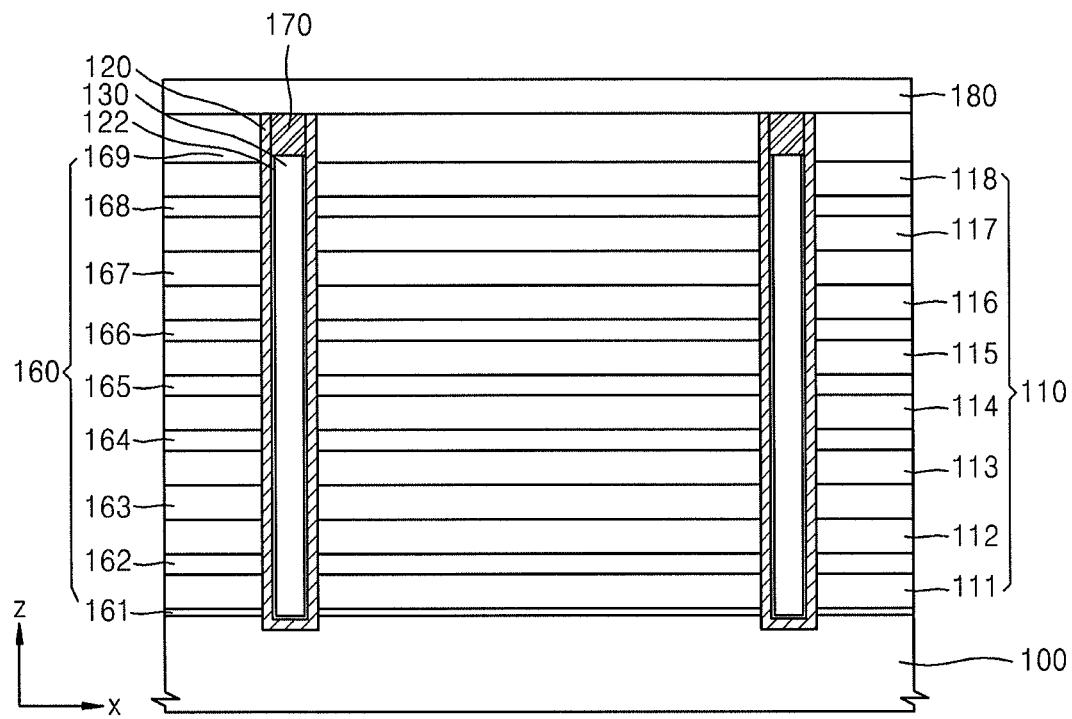

Referring to FIG. 4G, a material included in a conductive layer 170 may be deposited at a position where the buried insulating layer 130 is removed. For example, in the first openings Ta lateral sides of at least the ninth interlayer insulating layer 169 may be exposed so that the buried insulating layer 130 does not completely fill an entire height of the first openings Ta. The conductive layer 170 may be formed so as to fill the entire height of the first openings Ta. The conductive layer 170 may be formed by performing the planarization process again, e.g., so that an upper surface of the ninth interlayer insulating layer 169 is exposed. After the conductive layer 170 is formed, an upper insulating layer 180 may be formed on the ninth interlayer insulating layer 169. The upper insulating layer 180 may cover a plurality of first openings Ta.

Figure 4H:
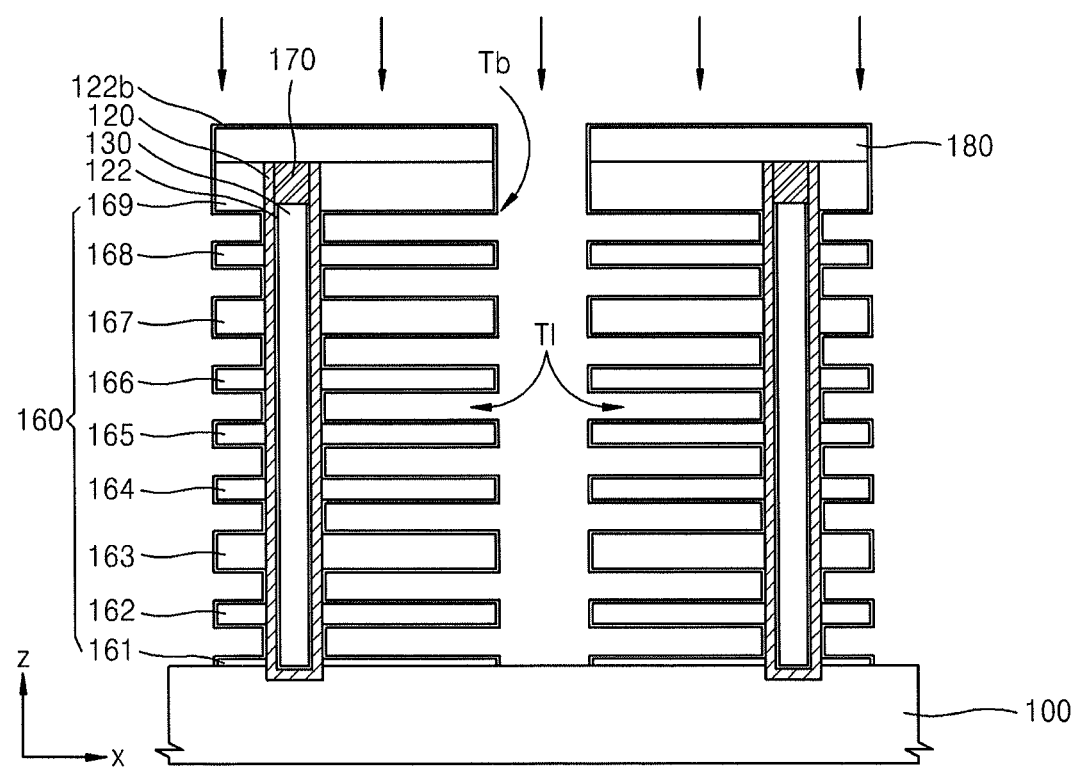

Referring to FIG. 4H, second openings Tb through which the substrate 100 is exposed may be formed. The second openings Tb may be formed between adjacent first openings Ta in the x-axis direction. The second openings Tb may extend in the y-axis direction (see FIG. 2), e.g., so as to be between a plurality of first openings Ta that are adjacent to each other in the x-axis direction. According to an exemplary embodiment, the second openings Tb may be formed in every other channel region 120. However, embodiments are not limited thereto, and the relative arrangement of the channel regions 120 and the second openings Tb may be changed.

The second openings Tb may be formed by using a photolithography process and anisotropically etching the upper insulating layer 180, the interlayer insulating layers 160, and the interlayer sacrificial layers 110. The second openings Tb extend in the y-axis direction in correspondence to a region in which the common source line 175 is to be formed at a subsequent process. The interlayer sacrificial layers 110 exposed through the second openings Tb may be removed through the etching process so that, e.g., a plurality of side openings Tl defined between the interlayer insulating layers 160 may be formed. Some regions of the sidewalls of the channel region 120 may be exposed through the side openings Tl.

Optionally, an additional buffer layer 122b may be formed on the channel region 120 exposed through the side openings Tl. The additional buffer layer 122b may cover exposed surfaces of the interlayer insulating layers 160. The additional buffer layer 122b may be formed by using the same material and a similar and/or same type process as used to form the buffer layer 122 of FIG. 4C. The heat treatment described with reference to FIG. 4C may be performed on the additional buffer layer 122b in the same way as discussed with respect to the buffer layer 120. In a modified exemplary embodiment, if the additional buffer layer 122b is formed, the heat treatment may be performed in this operation. For example, after forming the channel region 120 of FIG. 4C, the operations of forming the buffer layer 122 and performing the heat treatment may be skipped. Accordingly, the operation of forming the additional buffer layer 122b may be performed and the heat treatment may be performed thereafter.

Operations of forming the buffer layer 122 or the additional buffer layer 122a and performing the heat treatment may be performed after the channel region 120 is formed, in this operation, or in both operations. In this regard, the heat treatment may be performed after forming the buffer layer 122 and/or after forming the additional buffer layer 122b.

Figure 4I:
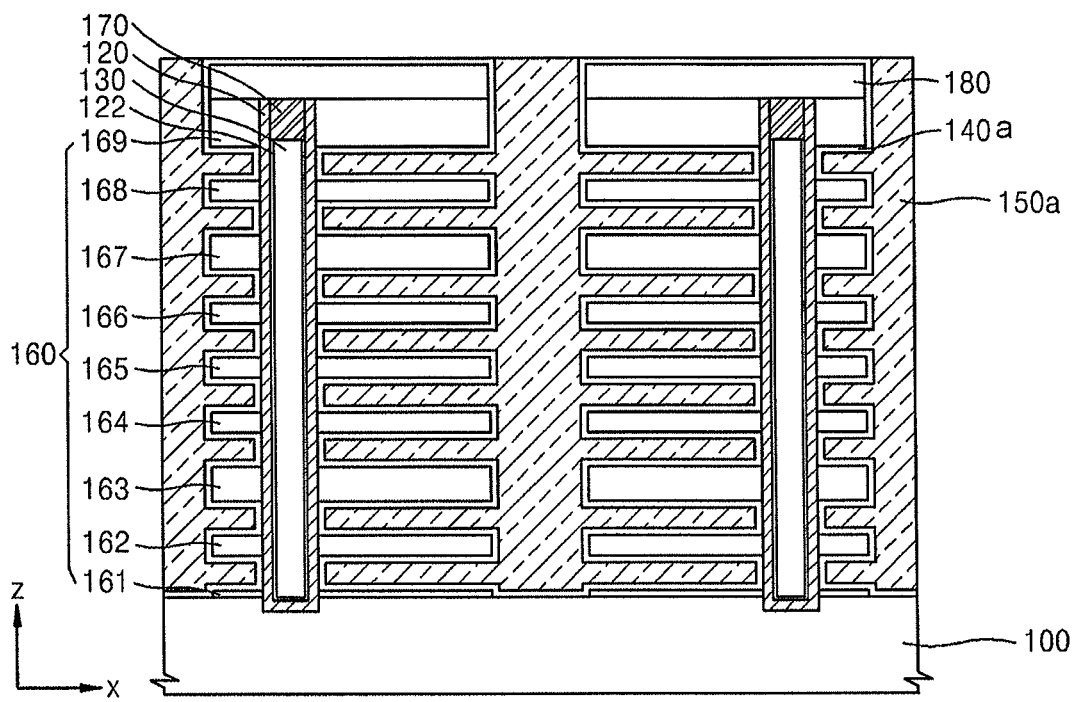

Referring to FIG. 4I, a gate dielectric forming layer 140a may be formed to uniformly cover the channel region 120, the interlayer insulating layers 160, and the substrate 100 that are exposed through the second openings Tb and the side openings Tl. Thereafter, e.g., at a later stage, the gate dielectric forming layer 140a may be etched to form the gate dielectric layer 140. Optionally, before the gate dielectric forming layer 140a is formed, the additional buffer layer 122a may be removed. In an exemplary embodiment, if the additional buffer layer 122a is not removed, the additional buffer layer 122a may be used as a part of the gate dielectric layer 140.

The gate dielectric layer 140 may include the tunneling insulating layer 142, the charge storage layer 144, and the blocking insulating layer 146 that are sequentially stacked from the channel region 120, e.g., as illustrated in FIG. 3A. The tunneling insulating layer 142, the charge storage layer 144, and the blocking insulating layer 146 may be formed using, e.g., ALD, CVD, or physical vapor deposition (PVD).

Next, referring to FIG. 4I, a conductive material 150a may be buried in the second openings Tb and the side openings Tl. The conductive material 150a may fill, e.g., completely fill, the second openings Tb and the side openings Tl.

Figure 4J:
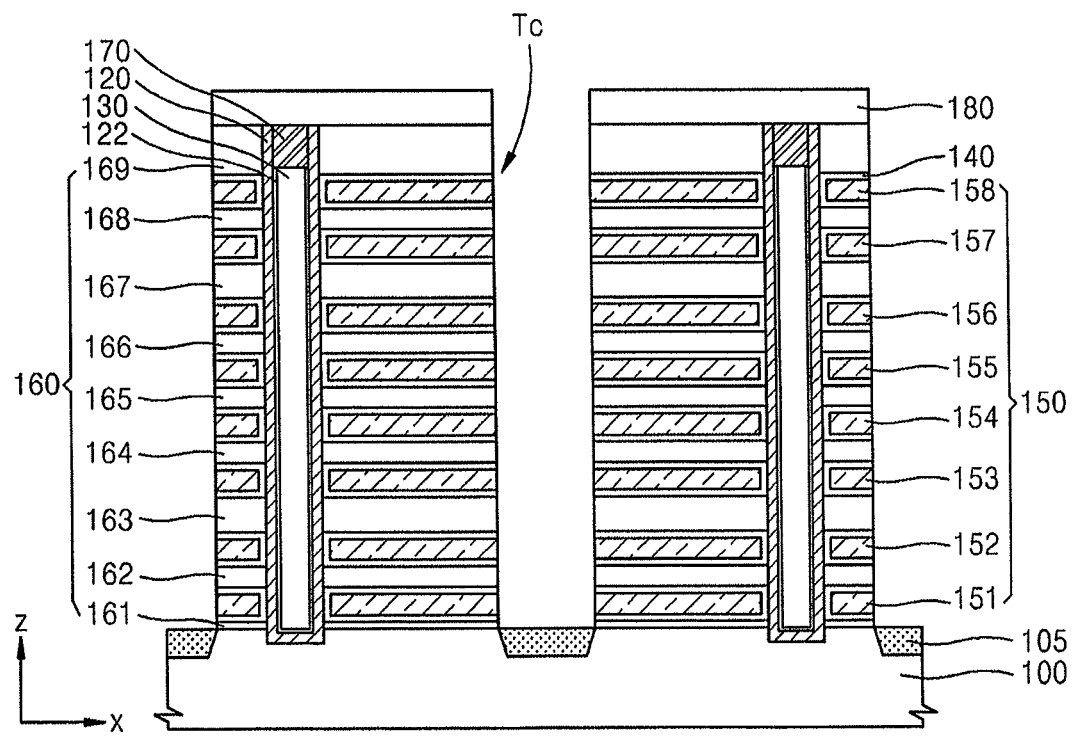

Referring to FIG. 4J, third openings Tc may be formed by partially etching the conductive material 150a. Thus, the gate electrode 150 may be formed by burying the conductive material 150a only in the side openings Tl of FIG. 4H. The third openings Tc may be formed by anisotropic etching, e.g., removing portions of the conductive material 150a outside the side openings Tl, and the gate dielectric forming layer 140a formed on the substrate 100 and the top surface of the upper insulating layer 180 may be removed by anisotropic etching. The gate dielectric layers 140 formed in side surfaces of the interlayer insulating layers 160 may also be removed. Optionally, the gate dielectric layers 140 formed in side surfaces of the interlayer insulating layers 160 may not be removed. Thereafter, impurities may be injected into the substrate 100 through the third openings Tc, thereby forming an impurity region 105.

Figure 4K:
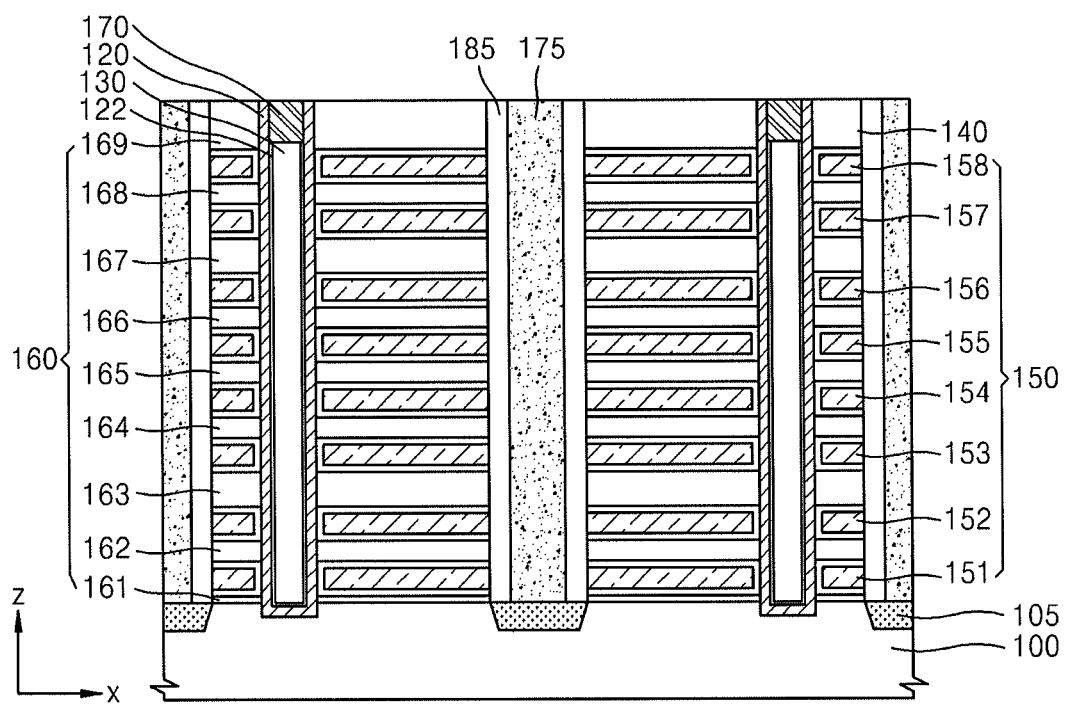

Referring to FIG. 4K, the insulating region 185 and the common source line 175 that are buried in the third openings Tc may be formed. The insulation layer 185 may be formed by burying an insulating material in the third openings Tc and anisotropically etching the third openings Tc. The insulating region 185 may be formed of the same material as the interlayer insulating layer 160. Next, the common source line 175 may be formed by further performing a deposition process and an etching process, such as an etch-back process of the conductive material 150a.

Next, an impurity injection process may be performed on the string selection transistors SST1 and SST2 (see FIG. 2) of the memory cell string formed along the channel region 120. The impurity may include, e.g., n-type impurities including elements such as phosphorus (P), arsenic (As), and/or antimony (Sb) or p-type impurities including elements such as boron (B), aluminum (Al), gallium (Ga), and/or zinc (Zn). The impurity injection process may be optionally skipped or may be performed in another operation.

Figure 4L:
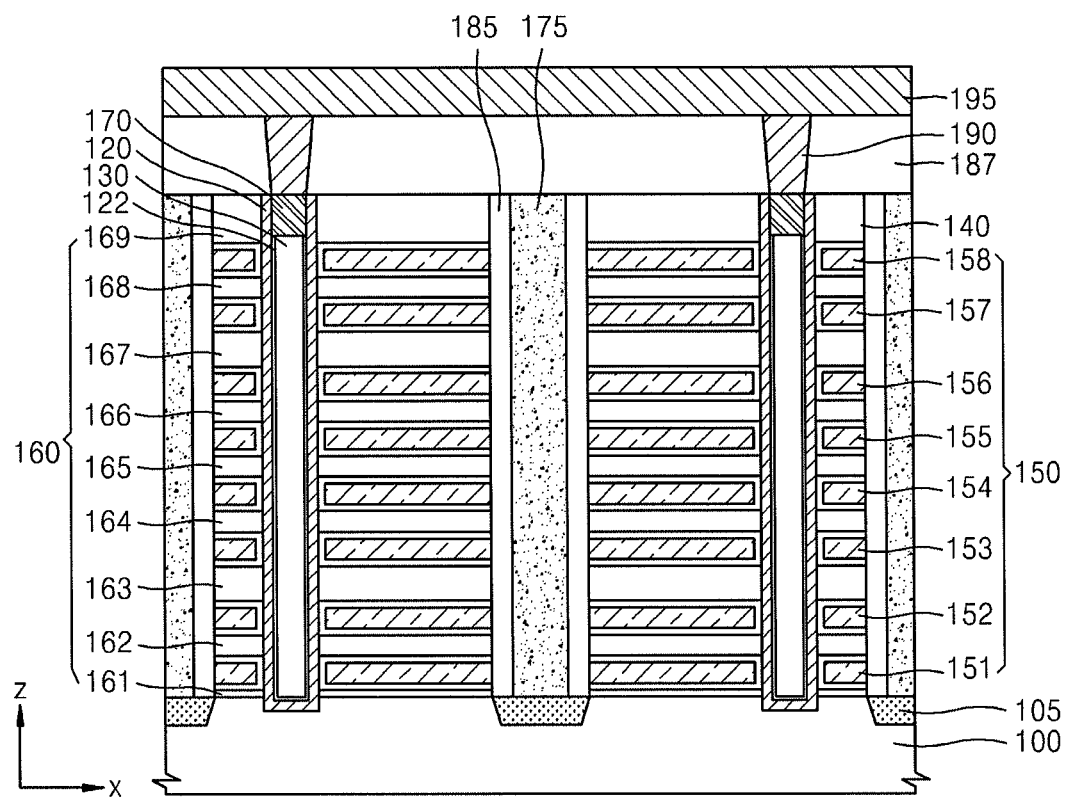

Referring to FIG. 4L, a wire insulating layer 187 may be formed on the ninth interlay insulating layer 169 and the common source line 175. A plurality of bit line contact plugs 190 may be formed in the wire insulating layer 187. The bit line contact plugs 190 may be formed by forming a contact using photolithography and etching processes and depositing a conductive material in the contact. Each of the bit line contact plugs 190 may overlap corresponding conductive layers 170 in the first openings Ta.

Next, a bit line 195, which extends in the x-axis direction, that connects the bit line contact plugs 190 arranged in the x-axis direction may be formed on the wire insulating layer 187. The bit line 195 may be formed in a line shape using, e.g., the deposition, photolithography, and etching processes.

In accordance with an exemplary embodiment, the trap density of the channel region 120 of the semiconductor device 1000 of the present embodiment may be reduced, thereby decreasing a distribution of threshold voltages of a plurality of semiconductor devices and enhancing endurance thereof.

Figure 5:
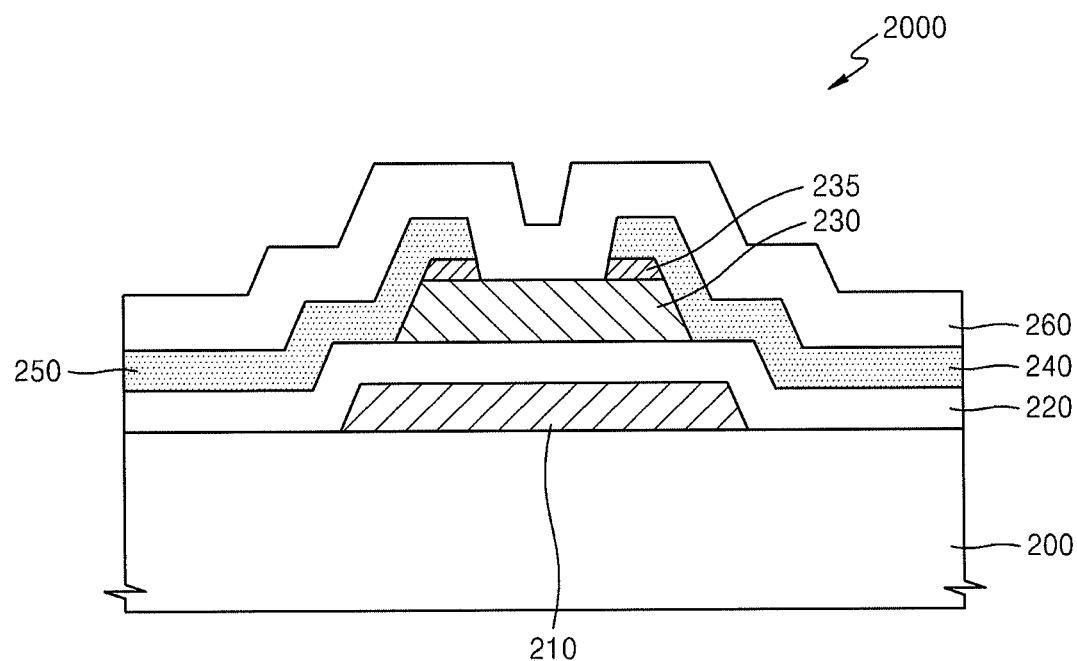
FIG. 5 illustrates a cross-sectional view of a semiconductor device, according to an exemplary embodiment.

FIG. 5 illustrates a cross-sectional view of a semiconductor device 2000 according to another exemplary embodiment. In the exemplary embodiment, a bottom gate type thin film transistor (TFT) is exemplified.

Referring to FIG. 5, the semiconductor device 2000 includes a gate electrode 210, a gate insulating layer 220, and a channel region 230 that are sequentially stacked on a substrate 200. The semiconductor device 2000 may further include an ohmic contact layer 235, a drain electrode 240, and a source electrode 250 that cover a part of the channel region 230. A protection layer 260 may be disposed on top portions of the drain electrode 240, the source electrode 250, and the channel region 230.

The substrate 200 may include glass or plastic. If the semiconductor device 2000 is used in a display device, the substrate 200 may include an insulating layer.

The gate electrode 210 may include a conductive material, and constitute a complex layer of a transparent conductive layer and an opaque conductive layer. For example, the transparent conductive layer may include at least one of indium tin oxide (ITO), indium zinc oxide (IZO), and tin oxide (TO). The opaque conductive layer may include at least one of aluminum (Al), silver (Ag), copper (Cu), molybdenum (Mo), chromium (Cr), tantalum (Ta), and titanium (Ti).

The gate insulating layer 220 may include at least one of a silicon oxide (e.g., $SiO_2$), a silicon nitride (e.g., $Si_3N_4$), silicon oxynitride (SiON), a hafnium oxide (e.g., $HfO_2$), a hafnium silicon oxide (e.g., $HfSi_xO_y$), an aluminum oxide (e.g., $Al_2O_3$), and a zirconium oxide (e.g., $ZrO_2$).

The channel region 230 corresponds to a layer in which a channel of the semiconductor device 2000 is formed between the drain electrode 240 and the source electrode 250. The channel region 230 may include, e.g., polycrystalline silicon. The ohmic contact layer 235 may include n+ polycrystalline silicon doped with, e.g., high density n-type impurities, or silicide. The ohmic contact layer 235 may be disposed on the channel region 230, e.g., thereby reducing a difference in a work function between the channel region 230 and the drain electrode 240 and/or between the channel region 230 and the source electrode 250.

The drain electrode 240 and the source electrode 250 may be symmetrically disposed to face each other with respect to the gate electrode 210. The source electrode 250 may transfer a signal to the drain electrode 240 through the channel formed in the channel region 230 while a signal is applied to the gate electrode 210. The drain electrode 240 and the source electrode 250 may include, e.g., a fire resistance metal, such as molybdenum (Mo), chromium (Cr), or tantalum (Ta), or titanium (Ti).

The protection layer 260 may be disposed on the drain electrode 240, the source electrode 250, and the exposed channel region 230, e.g., to protect the exposed channel region 230. The protection layer 260 may include an inorganic insulating substance or an organic insulating substance.

The bottom gate type TFT of the semiconductor device 2000 may be used as, e.g., a switching device of a liquid crystal display (LCD) or an organic light emitting display (OLED).

Figure 6A:
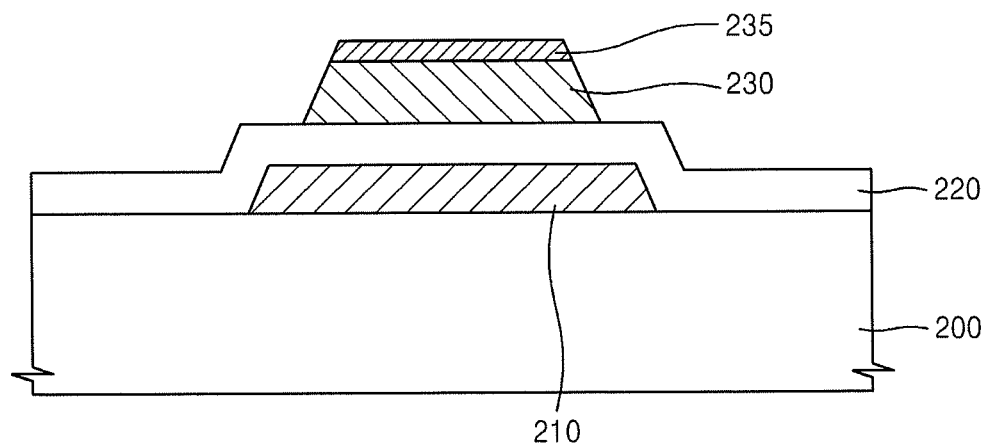
FIGS. 6A through 6C illustrate cross-sectional views depicting stages in a method of manufacturing the semiconductor device of FIG. 5, according to an exemplary embodiment.
Figure 6B:
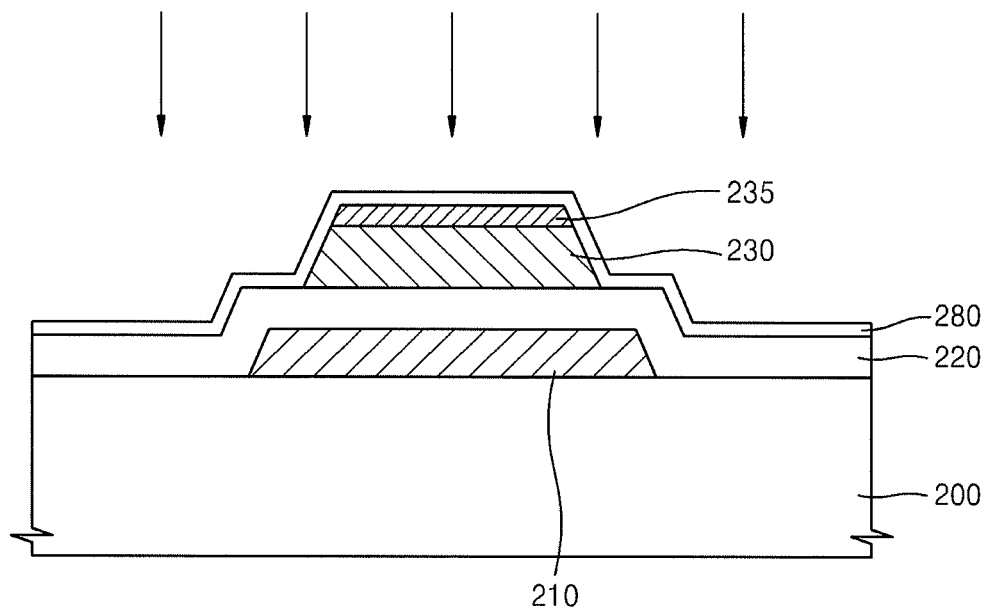
Figure 6C:
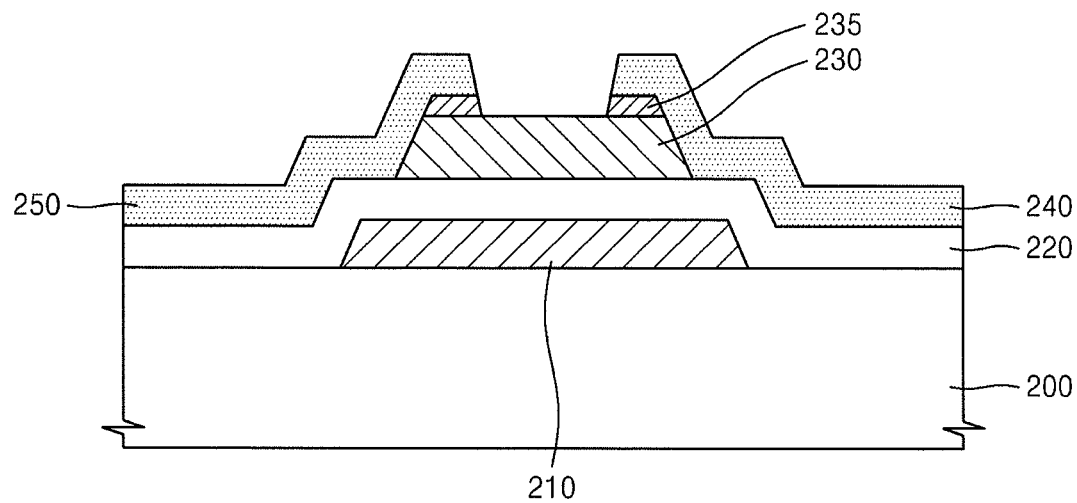

FIGS. 6A through 6C illustrate cross-sectional views for depicting stages in a method of manufacturing the semiconductor device 2000 of FIG. 5, according to another exemplary embodiment.

Referring to FIG. 6A, the gate electrode 210 may be formed on the substrate 200. An operation of forming the gate electrode 210 may include an operation of sequentially stacking a transparent conductive layer and an opaque conductive layer by, e.g., sputtering, and forming a stack structure. The operation of forming the gate electrode 210 may include an operation of forming a predetermined mask pattern for defining a position of the gate electrode 210 on the stack structure and an operation of etching the stack structure by using the mask pattern as an etching mask.

Next, the gate insulating layer 220 may be formed on the gate electrode 210. The gate insulating layer 220 may be formed, e.g., by using PECVD. A thickness of the gate insulating layer 220 may be in a range of about 2,000 Å to about 5,000 Å. Next, a photoresist pattern (not shown) may be formed by sequentially stacking materials that constitute the channel region 230 and the ohmic contact layer 235 on the gate insulating layer 220. The photoresist pattern may be used to perform photolithography and etching processes and to form the channel region 230 and the ohmic contact layer 235 of FIG. 6A. In a modified exemplary embodiment, the ohmic contact layer 235 may be skipped.

Referring to FIG. 6B, a buffer layer 280 may be formed on the gate insulating layer 220 and the ohmic contact layer 235. The buffer layer 280 may include an insulating material, such as silicon oxide or silicon nitride. A thickness of the buffer layer 280 may be in a range of about 5 Å to about 15 Å. If the thickness of the buffer layer 280 exceeds this range, halogen atoms may be prevented from spreading to the channel region 230 during a subsequent thermal process.

The buffer layer 280 may be formed by using a thermal oxidation process, a plasma oxidation process, an ALD process, or a PECVD process. If the buffer layer 280 is silicon oxide, the buffer layer 280 may be formed by cleansing the channel region 230 by using a SC1 solution that is a mixture solution of ammonia water and oxygenated water, chemically oxidizing the channel region 230, and forming a chemical oxide layer. In a modified exemplary embodiment, the buffer layer 240 may be formed on a native oxide layer or may be formed of native oxide.

Next, the heat treatment may be performed on the channel region 230. An arrow of FIG. 6B indicates that the heat treatment is performed. The heat treatment may be performed at a temperature of about 300° C. to about 500° C. and at a pressure of about 100 Torr by using a halogen containing gas. The heat treatment using the halogen containing gas may be performed for several minutes or several tens of minutes, e.g., for more than 3 minutes. These ranges of the temperature, pressure, and time may vary according to the thickness of the channel region 230 in such a way that halogen atoms can spread into the channel region 230. The halogen containing gas may include at least one of $Cl_2$, $ClF_3$, $F_2$, and $NF_3$ gases.

In accordance with an exemplary embodiment, the buffer layer 280 may be formed and the heat treatment may be performed thereafter, e.g., to cure and/or reduce a defect in the channel region 230 including polycrystalline silicon. For example, the defect may be a defect in a grain boundary. The halogen containing gas may reduce a dangling bonding in the channel region 230 and replace an Si—H combination with an Si—Cl or Si—F combination. Thus, a trap density in the channel region 230 may be reduced. The reduction in the trap density may enhance the characteristics of a semiconductor device, which will be described in detail later with reference to FIGS. 9A through 11.

Referring to FIG. 6C, a process of removing the buffer layer 280 may be performed. The buffer layer 280 may be removed by using, e.g., a wet etching process.

Next, a process of forming the drain electrode 240 and the source electrode 250 may be performed. A conductive material may be formed to cover top portions of the ohmic contact layer 235 and the gate insulating layer 220. Thereafter, an operation of forming a predetermined mask pattern through which a center of the channel region 230 is partially exposed on the conductive material and an operation of removing the conductive material and the ohmic contact layer 235 by using the mask pattern as an etching mask. Accordingly, the drain electrode 240 and the source electrode 250 may be formed.

The trap density of the channel region 230 of the semiconductor device 2000 of the present embodiment is reduced, thereby decreasing a distribution of threshold voltages of a plurality of semiconductor devices and increasing an on-current.

Figure 7:
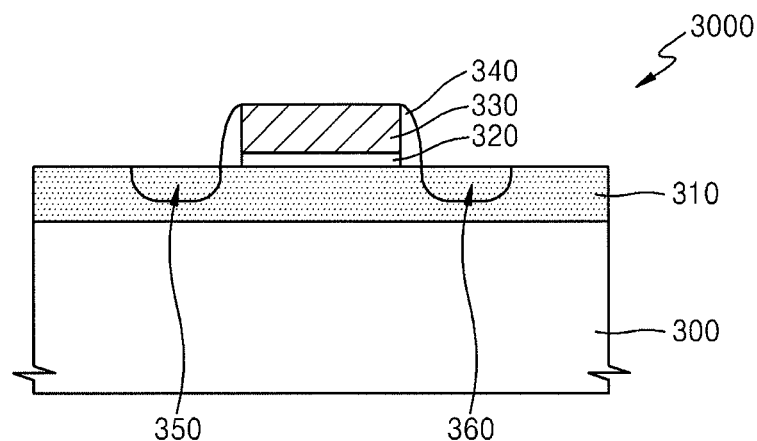
FIG. 7 illustrates a cross-sectional view of a semiconductor device, according to an exemplary embodiment.

FIG. 7 illustrates a cross-sectional view of a semiconductor device 3000 according to another exemplary embodiment. In the exemplary embodiment embodiment, a top gate type TFT is exemplified.

The semiconductor device 3000 may include a polycrystalline silicon layer 310 that is disposed on a substrate 300 and may include a source region 350 and a drain region 360 within the polycrystalline silicon layer 310. A gate insulating layer 320 and a gate electrode 330 may be disposed on the polycrystalline silicon layer 310. A spacer 340 may be disposed on side walls of the gate insulating layer 320 and the gate electrode 330.

The substrate 300 may include a semiconductor material, e.g., silicon, germanium, or silicon-germanium. The substrate 300 may be provided as a bulk wafer or an epitaxial layer. If the semiconductor device 3000 is used for a display device, the substrate 300 may include an insulating material such as glass or plastic.

The polycrystalline silicon layer 310 includes the source region 350 and the drain region 360 that are disposed adjacent to opposing side walls of the gate electrode 330. The source region 350 and the drain region 360 may include, e.g., p-type or n-type impurities.

The gate insulating layer 320 may include one of a silicon oxide (e.g., $SiO_2$), a silicon nitride (e.g., $Si_3N_4$), silicon oxynitride (SiON), a hafnium oxide (e.g., $HfO_2$), a hafnium silicon oxide (e.g., $HfSi_xO_y$), an aluminum oxide (e.g., $Al_2O_3$), and a zirconium oxide (e.g., $ZrO_2$), and may be a single layer or a composite layer.

The gate electrode 330 may include polycrystalline silicon, metal silicide, or metal. The gate electrode 330 may be a single layer or a composite layer. The spacer 340 may be disposed to be insulated from layers that are to be subsequently formed, and may include a silicon nitride or a silicon oxide.

Figure 8A:
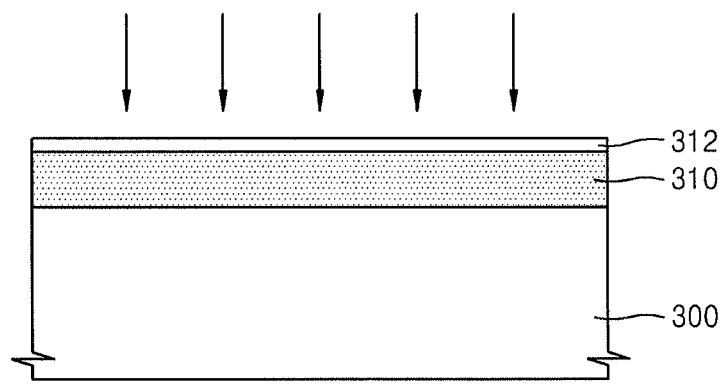
FIGS. 8A and 8B illustrate cross-sectional views depicting stages in a method of manufacturing the semiconductor device of FIG. 7, according to an exemplary embodiment.
Figure 8B:
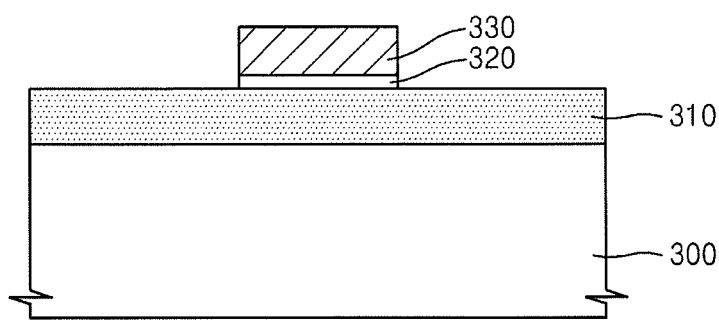

FIGS. 8A and 8B illustrate cross-sectional views for depicting stages in a method of manufacturing the semiconductor device 3000 of FIG. 7, according to an exemplary embodiment.

Referring to FIG. 8A, the polycrystalline silicon layer 310 may be formed on the substrate 300. The polycrystalline silicon layer 310 may be formed by depositing amorphous silicon and performing a separate heat treatment on the amorphous silicon or directly depositing polycrystalline silicon.

Next, a buffer layer 312 may be formed on the polycrystalline silicon layer 310. The buffer layer 312 may include an insulating material, such as a silicon oxide or a silicon nitride. A thickness of the buffer layer 312 may be in a range of about 5 Å to about 15 Å. If the thickness of the buffer layer 312 exceeds this range, halogen atoms may be prevented from spreading to the polycrystalline silicon layer 310 during a subsequent thermal process. The buffer layer 312 may be formed by using a thermal oxidation process, a plasma oxidation process, an ALD process, or a PECVD process. If the buffer layer 312 is a silicon oxide, the buffer layer 312 may be formed by cleansing the polycrystalline silicon layer 310 by using a SC1 solution that is a mixture solution of ammonia water and oxygenated water, chemically oxidizing the polycrystalline silicon layer 310, and forming a chemical oxide layer. In a modified embodiment, the buffer layer 312 may be formed on a native oxide layer or may be formed of native oxide.

Next, the heat treatment may be performed on the channel region 230. An arrow of FIG. 8A indicates that the heat treatment is performed. The heat treatment may be performed at a temperature of about 300° C. to about 500° C. and at a pressure of about 100 Torr by using halogen containing gas. The heat treatment using the halogen containing gas may be performed for several minutes or several tens of minutes, e.g., for more than 3 minutes. These ranges of the temperature, pressure, and time may vary according to the thickness of the channel region 230 in such a way that halogen atoms can spread into the polycrystalline silicon layer 310. The halogen containing gas may include at least one of $Cl_2$, $ClF_3$, $F_2$, and $NF_3$ gases.

In accordance with an exemplary embodiment, the buffer layer 312 may be formed and the heat treatment may be performed thereafter, e.g., to cure and/or reduce a defect in the polycrystalline silicon layer 310 that includes polycrystalline silicon. For exemplary, the defect may be a defect in a grain boundary. For example, the halogen containing gas may reduce a dangling bonding in the channel region 230 and replace an Si—H combination with an Si—Cl or Si—F combination. The Si—Cl or Si—F combination has a greater combined energy than the Si—H combination. Thus, a trap density in the polycrystalline silicon layer 310 may be reduced. The reduction in the trap density may enhance the characteristics of a semiconductor device, which will be described in detail later with reference to FIGS. 9A through 11.

Referring to FIG. 8B, materials that constitute the gate insulating layer 320 and the gate electrode 330 may be sequentially stacked. Optionally, a process of removing the buffer layer 312 may be performed before the gate insulating layer 320 is formed. Next, the gate insulating layer 320 and the gate electrode 330 may be formed by forming a predetermined mask pattern on a stack structure of the materials and performing photolithography and etching processes.

Thereafter, the spacer 340 may be formed on side walls of the gate insulating layer 320 and the gate electrode 330. The spacer 340 may be formed by depositing a spacer material, anisotropically etching the spacer material, and letting the spacer material remain on the side walls of the gate insulating layer 320 and the gate electrode 330. Next, the gate electrode 330 may be used as a mask to dope impurities, thereby forming the source region 350 and the drain region 360. The shapes of the source region 350 and the drain region 360 are not limited to those shown in the drawings, and may be modified. For example, the shapes of the source region 350 and the drain region 360 may extend to side surfaces closer to the gate electrode 330 than as shown in FIG. 7.

The trap density of the polycrystalline silicon layer 310 of the semiconductor device 3000 may be reduced, thereby decreasing a distribution of threshold voltages of a plurality of semiconductor devices and increasing an on-current.

Figure 9A:
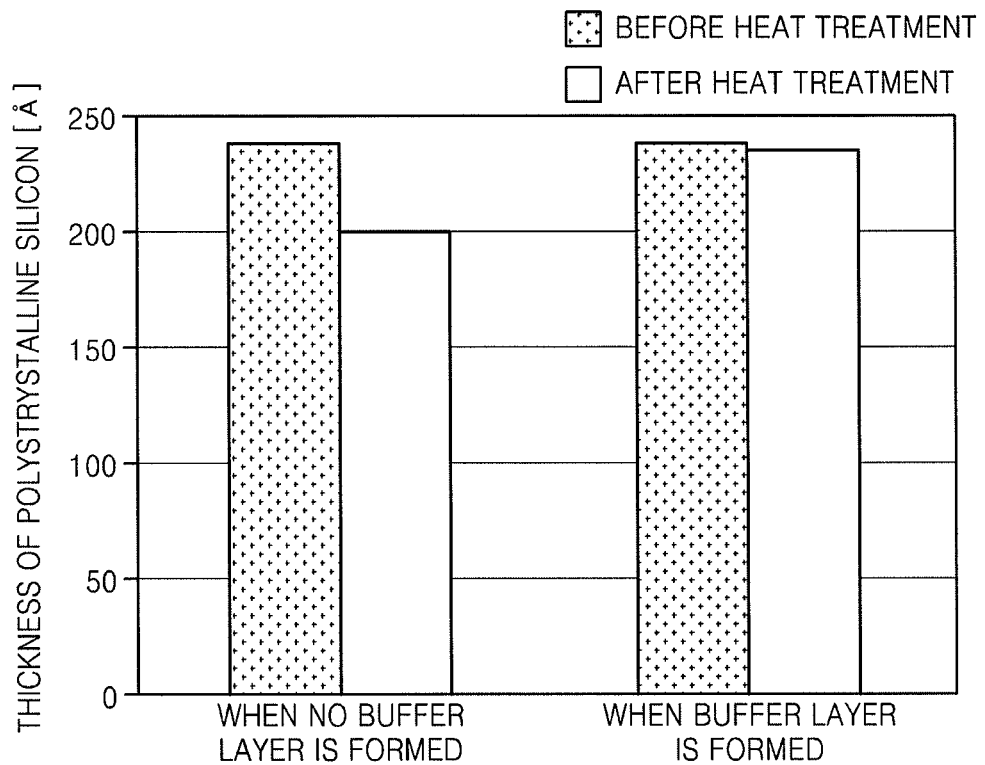
FIGS. 9A and 9B illustrate graphs for explaining characteristics of a polycrystalline silicon layer processed by using a manufacturing method, according to an exemplary embodiment.
Figure 9B:
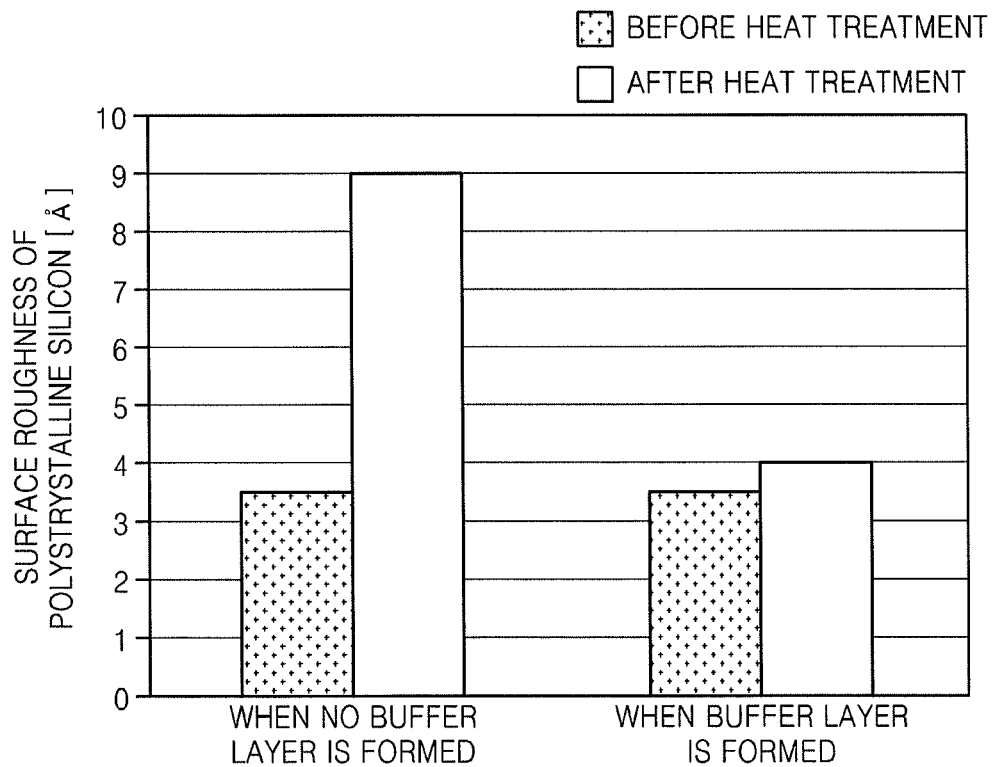

FIGS. 9A and 9B illustrate graphs for explaining characteristics of a polycrystalline silicon layer processed by using a manufacturing method according to an exemplary embodiment. The graphs of FIGS. 9A and 9B show analysis results obtained by forming the polycrystalline silicon layer on a silicon oxide layer, forming the silicon oxide layer that is a chemical oxide layer having a thickness of 10 Å through SC1 cleansing as a buffer layer on the polycrystalline silicon layer, and heat-treating the polycrystalline silicon for 4 minutes using chlorine ($Cl_2$) gas.

Referring to FIG. 9A, the graph shows a variation of thickness of the polycrystalline silicon layer when the polycrystalline silicon layer is heat-treated after the buffer layer is formed, and when the polycrystalline silicon layer is heat-treated without forming a buffer layer.

When a buffer layer is not formed, a difference in the thickness in the polycrystalline silicon layer before and after the polycrystalline silicon layer is heat-treated is above 30 Å. Meanwhile, when the buffer layer is formed, the thickness in the polycrystalline silicon layer before and after the polycrystalline silicon layer is heat-treated is only negligibly different. When the chlorine ($Cl_2$) gas reacts with silicon (Si) atoms on a silicon surface, a high volatile byproduct such as $SiCl_4$ is formed, and thus the polycrystalline silicon layer may be etched. Therefore, when a buffer layer is not formed, the polycrystalline silicon layer may be etched, which reduces the thickness thereof. When the buffer layer is formed, the chlorine ($Cl_2$) gas may be prevented or blocked from reacting with silicon (Si) atoms on the silicon surface, and thus the polycrystalline silicon layer may be protected.

Referring to FIG. 9B, the graph shows a variation in surface roughness of the polycrystalline silicon layer when the polycrystalline silicon layer is heat-treated after the buffer layer is formed, and when the polycrystalline silicon layer is heat-treated without forming the buffer layer.

When the buffer layer is not formed, a difference in the surface roughness in the polycrystalline silicon layer before and after the polycrystalline silicon layer is heat-treated is above 5 Å. When the buffer layer is formed, the surface roughness in the polycrystalline silicon layer before and after the polycrystalline silicon layer is heat-treated is only negligibly different. This is because the polycrystalline silicon layer is etched by using the chlorine ($Cl_2$) gas as described above. Furthermore, when the chlorine ($Cl_2$) gas is used to etch the polycrystalline silicon layer, since such etching is greatly influenced by a crystalline direction, the surface roughness was observed to increase. Therefore, when the polycrystalline silicon layer is heat-treated after the buffer layer is formed according to the exemplary embodiment, the variation in the surface roughness of the polycrystalline silicon layer may be minimized.

Accordingly, the method of manufacturing the semiconductor device may cure a defect of the polycrystalline silicon layer while reducing the possibility of and/or preventing the thickness and surface of the polycrystalline silicon layer that forms a channel region from being affected or damaged. Furthermore, the variations in the thickness and the surface roughness of the polycrystalline silicon layer are minimized, which may maintain the constant characteristics of semiconductor devices, thereby reducing a distribution of electrical characteristics such as threshold voltages.

Figure 10A:
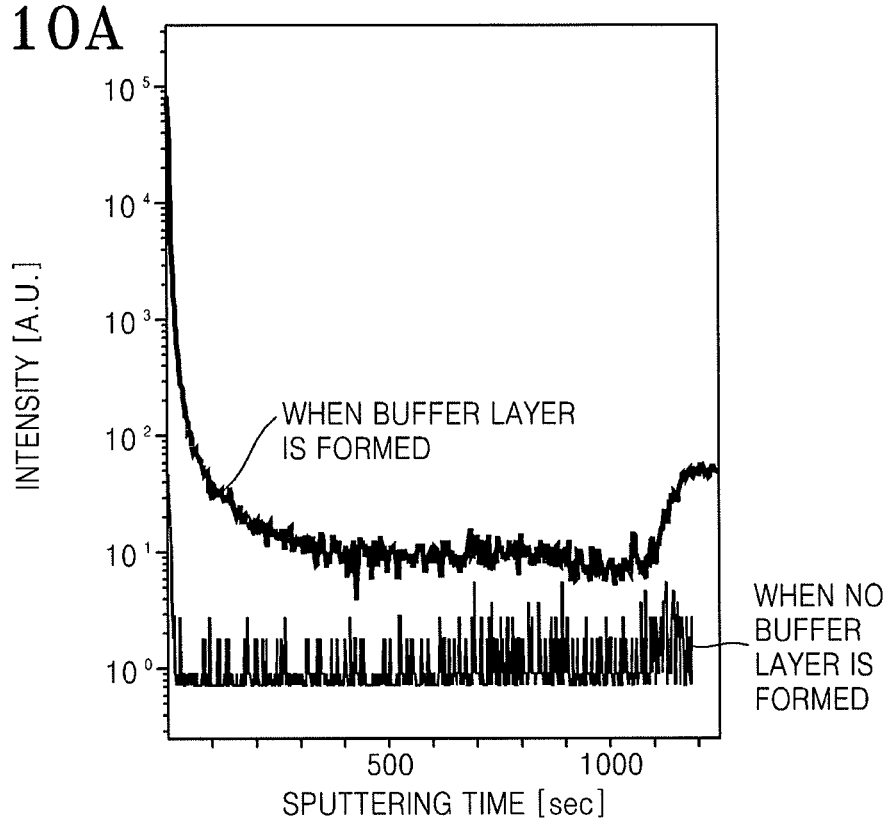
FIGS. 10A and 10B illustrate graphs for comparing chlorine (Cl) and hydrogen (H) contents of a polycrystalline silicon layer processed by using a manufacturing method, according to an exemplary embodiment.
Figure 10B:
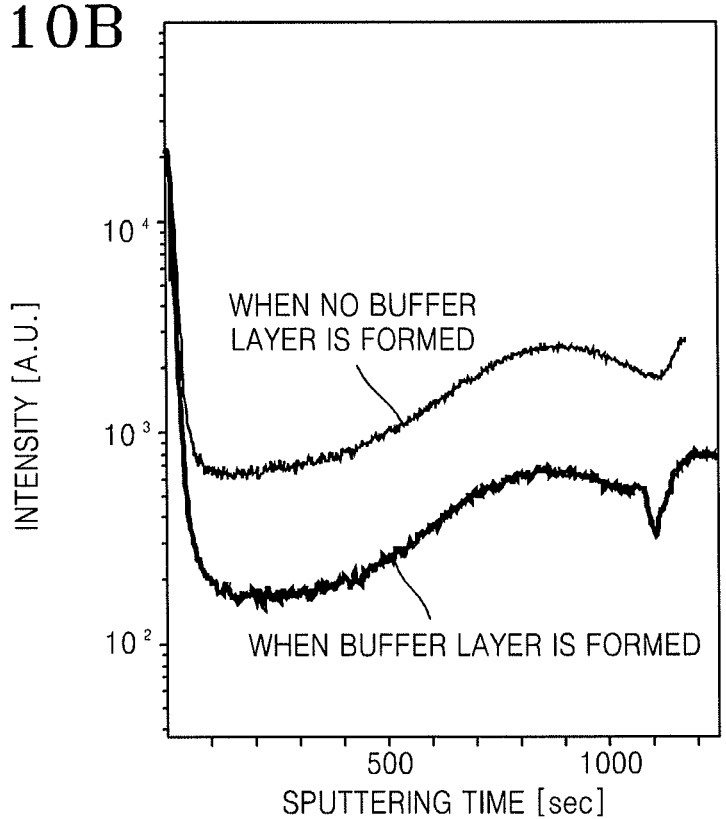

FIGS. 10A and 10B illustrate graphs for comparing chlorine (CO and hydrogen (H) contents of a polycrystalline silicon layer processed by using a manufacturing method according to an exemplary embodiment. The chlorine (Cl) and hydrogen (H) contents are analyzed by using a secondary ion mass spectrometer (SIMS). The SIMS analysis is used to qualitatively and quantitatively analyze an atom. An analysis sample is manufactured under the same conditions as shown in FIGS. 9A and 9B.

Referring to FIG. 10A, the chlorine (Cl) content is analyzed from the polycrystalline silicon layer with respect to a sputtering time by sputtering and etching a top side of the heat-treated polycrystalline silicon layer. The chlorine (Cl) content indicates a relative value by using intensity. When a buffer layer is formed in the exemplary embodiment, the chlorine (Cl) content is higher compared to when no buffer layer is formed.

Referring to FIG. 10B, the hydrogen (H) content is analyzed from the polycrystalline silicon layer with respect to a sputtering time by sputtering and etching a top side of the heat-treated polycrystalline silicon layer. The hydrogen (H) content indicates a relative value by using intensity. When the buffer layer is formed in the present exemplary embodiment, the hydrogen (H) content is lower compared to when no buffer layer is formed.

If chlorine ($Cl_2$) gas is used to perform heat treatment on the polycrystalline silicon layer, chlorine (CO atoms spread in, e.g., diffuse to, a grain boundary of polycrystalline silicon. The spreading of the chlorine (Cl) atoms may cure and/or reduce a defect such as a dangling defect in the polycrystalline silicon, in particular, in the grain boundary. For example, the chlorine (Cl) atoms may replace an Si—H combination in the polycrystalline silicon with an Si—Cl combination.

Therefore, the concentration of chlorine (Cl) content is high and the hydrogen (H) content is low when the buffer layer is formed, which means that the chlorine (Cl) atoms efficiently replaces the Si—H combination with the Si—Cl combination. This is because the chlorine ($Cl_2$) gas does not react with silicon (Si) atoms on a silicon surface but spreads.

Figure 11:
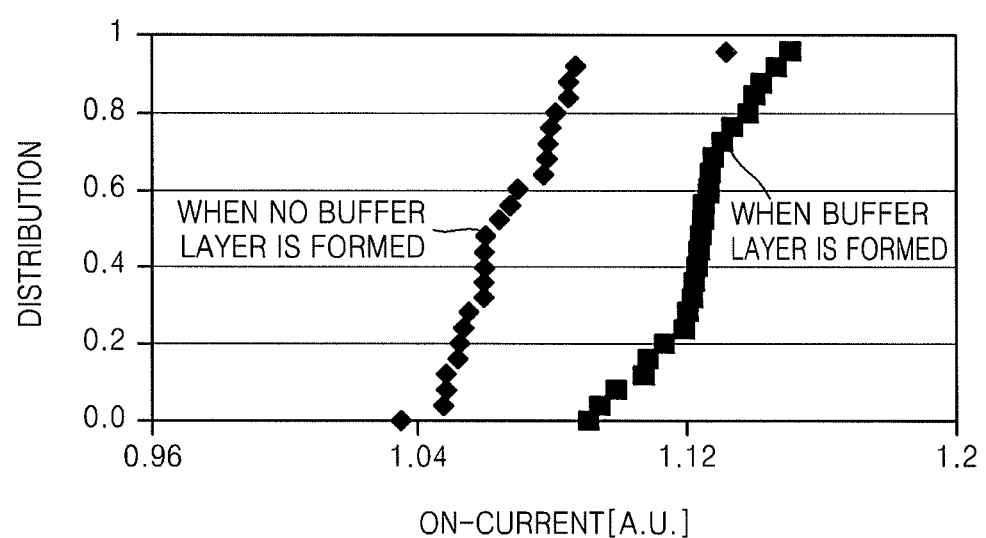
FIG. 11 illustrates a graph of current characteristics of a semiconductor device, according to an exemplary embodiment.

FIG. 11 illustrates a graph of current characteristics of a semiconductor device according to an exemplary embodiment.

Referring to FIG. 11, the graph shows an on-current distribution in the top gate type TFT as shown in FIG. 7. The top gate type TFT has a gate electrode size of 100 μm×100 μm, and is under the same conditions of forming a buffer layer and performing heat treatment as shown in FIGS. 9A and 9B. A horizontal axis of the graph indicates a current size in an unit, and a vertical axis thereof indicates an accumulative distribution of a plurality of transistors.

The on-current increases when the buffer layer is formed compared to when no buffer layer is formed. Threshold voltages of transistors are in proportion to a trap density in polycrystalline silicon. Therefore, when the trap density in polycrystalline silicon is reduced, threshold voltages decrease, and the on-current increases. Furthermore, a defect present in a grain boundary acts as an energy barrier and may cause a reduction in the on-current. Thus, if the defect present in the grain boundary is reduced, the on-current may increase. An increase in the on-current results in an increase in a sub-threshold swing.

Although not shown, when the trap density is reduced, if threshold voltages decrease, a distribution of threshold voltages between a plurality of semiconductor devices is reduced. The smaller the sizes of transistors are, the greater the influence of a trap, thereby producing a great effect from the reduction in the trap density.

By way of summation and review, design rules for of elements of the semiconductor device are changing, e.g., a gate length that is the standard of the design rules is decreasing. Thus, a channel forming process of a transistor becomes important to improve electrical characteristics of the semiconductor device. Accordingly, embodiments relate to a method of manufacturing a semiconductor device including a polycrystalline silicon channel. Embodiments also relate to a method of manufacturing a semiconductor device having a reduced distribution of threshold voltage values of transistors and enhanced current characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming a channel region;
   forming a buffer layer on the channel region; and
   heat-treating the channel region by using a gas containing halogen atoms.

2. The method as claimed in claim 1, wherein forming the buffer layer includes:
   cleansing the channel region to form a cleansed channel region, and
   forming the buffer layer on the cleansed channel region, the buffer layer being a chemical oxide layer.

3. The method as claimed in claim 1, further comprising, after heat-treating the channel region, removing the buffer layer.

4. The method as claimed in claim 1, wherein the channel region has a smaller hydrogen content after the channel region is heat-treated than before the channel region is heat-treated.

5. The method as claimed in claim 1, wherein, the buffer layer is formed by thermally oxidizing the channel region or is formed on the channel region by using a chemical vapor deposition process.

6. The method as claimed in claim 1, further comprising:
   forming a gate insulating layer on the channel region; and
   forming a gate electrode on the gate insulating layer.

7. The method as claimed in claim 1, wherein the channel region is a polycrystalline silicon layer.

8. The method as claimed in claim 7, wherein forming the channel region includes:
   forming an amorphous silicon layer, and
   crystallizing the amorphous silicon layer by a second heat-treatment to form the polycrystalline silicon layer.

9. The method as claimed in claim 1, wherein the buffer layer includes an insulating material.

10. The method as claimed in claim 9, wherein the buffer layer includes an oxide or a nitride.

11. The method as claimed in claim 1, wherein a thickness of the buffer layer is in a range of about 5 Å to about 15 Å.

12. A method of manufacturing a semiconductor device, the method comprising:
   alternately stacking interlayer sacrificial layers and interlayer insulating layers on a substrate;
   forming first openings through the interlayer sacrificial layers and the interlayer insulating layers, the first openings exposing the substrate;
   forming channel regions in the first openings;
   forming buffer layers on the channel regions; and
   heat-treating the channel regions by using a gas containing halogen atoms.

13. The method as claimed in claim 12, further comprising:
   forming buried insulating layers on the channel regions such that the first openings are filled;
   forming second openings through the interlayer sacrificial layers and the interlayer insulating layers, the second openings being between the channel regions and exposing the substrate;
   forming side openings through which the channel regions and the insulating layers are partially exposed, the side openings extending from the second openings and being formed by removing the interlayer sacrificial layers exposed through the second openings;
   forming gate dielectric layers in the side openings; and
   forming gate electrodes of memory cell transistors and selection transistors on the gate dielectric layers such that the gate electrodes fill the side openings.

14. The method as claimed in claim 13, wherein the buffer layers are formed on the channel regions after side openings are formed such that the buffer layers are formed on the exposed channel regions by the side openings.

15. The method as claimed in claim 13, further comprising, before forming the gate dielectric layers, removing the buffer layer.

16. A method of manufacturing a transistor, the method comprising:
   forming a polycrystalline silicon layer on a substrate to form a channel region;
   forming a buffer layer that covers the channel region; and
   heat-treating the channel region by applying a gas containing halogen atoms to the buffer layer.

17. The method as claimed in claim 16, wherein during the heat-treating of the channel region, halogen atoms from the gas spread into the polycrystalline silicon layer of the channel region whereby heat treating the channel region includes diffusing halogen atoms from the halogen containing gas into the polycrystalline silicon layer of the channel region.

18. The method as claimed in claim 17, wherein during the heat-treating of the channel region, a hydrogen content in the polycrystalline silicon layer of the channel region is reduced.

19. The method as claimed in claim 17, wherein forming the buffer layer includes chemically oxidizing the channel region using a mixture including ammonia water and oxygenated water, the buffer layer being an oxide layer on an upper surface of the channel region on which the gas containing halogen atoms is directly applied.

20. The method as claimed in claim 19, wherein the buffer layer is formed directly on the polycrystalline silicon layer of the channel region.

* * * * *